(12) United States Patent
Zhou et al.

(10) Patent No.: US 8,847,313 B2
(45) Date of Patent: Sep. 30, 2014

(54) TRANSPARENT ELECTRONICS BASED ON TRANSFER PRINTED CARBON NANOTUBES ON RIGID AND FLEXIBLE SUBSTRATES

(75) Inventors: Chongwu Zhou, Arcadia, CA (US); Fumiaki Ishikawa, Torrance, CA (US); Hsiao-Kang Chang, Los Angeles, CA (US); Koungmin Ryu, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 394 days.

(21) Appl. No.: 12/538,597

(22) Filed: Aug. 10, 2009

(65) Prior Publication Data

US 2010/0127242 A1     May 27, 2010

Related U.S. Application Data

(60) Provisional application No. 61/117,519, filed on Nov. 24, 2008.

(51) Int. Cl.
| | | |
|---|---|---|
| *H01L 27/12* | (2006.01) | |
| *B82Y 10/00* | (2011.01) | |
| *H01L 51/00* | (2006.01) | |
| *H01L 51/05* | (2006.01) | |

(52) U.S. Cl.
CPC ........... *H01L 51/003* (2013.01); *H01L 51/0048* (2013.01); *B82Y 10/00* (2013.01); *H01L 51/0545* (2013.01); *H01L 51/0541* (2013.01)
USPC .......................................... 257/347; 257/40

(58) Field of Classification Search
USPC .................................................. 257/347, 40
See application file for complete search history.

(56) References Cited

U.S. PATENT DOCUMENTS

| | | | | |
|---|---|---|---|---|
| 7,714,386 | B2 * | 5/2010 | Pesetski et al. ................ | 257/347 |
| 7,723,223 | B2 * | 5/2010 | Kim et al. ..................... | 438/585 |
| 8,154,012 | B2 * | 4/2012 | Jiang et al. ...................... | 257/24 |
| 2012/0321785 | A1 * | 12/2012 | Rogers et al. .............. | 427/249.1 |

OTHER PUBLICATIONS

Artukovic, E., Kaempgen, M., Hecht, D. S., Roth, S., Grüner, G., Transparent and Flexible Carbon Nanotube Transistors. *Nano Lett.* 2005, 5, 757-760.

Cao, Q., Hur, S. H., Zhu, Z. T., Sun, Y., Wang, C. J., Meitl, M. A., Shim, M., Rogers, J. A., Highly Bendable, Transparent Thin-Film Transistors That Use Carbon-Nanotube-Based Conductors and Semiconductors with Elastomeric Dielectrics. *Adv. Mater.* 2006, 18, 304-309.

(Continued)

*Primary Examiner* — Mark Prenty
(74) *Attorney, Agent, or Firm* — Saliwanchik, Lloyd & Eisenschenk

(57) ABSTRACT

Methods and devices for transparent electronics are disclosed. According to an embodiment, transparent electronics are provided based on transfer printed carbon nanotubes that can be disposed on both rigid and flexible substrates. Methods are provided to enable highly aligned single-walled carbon nanotubes (SWNTs) to be used in transparent electronics for achieving high carrier mobility while using low-temperature processing. According to one method, highly aligned nanotubes can be grown on a first substrate. Then, the aligned nanotubes can be transferred to a rigid or flexible substrate having pre-patterned gate electrodes. Source and drain electrodes can be formed on the transferred nanotubes. The subject devices can be integrated to provide logic gates and analog circuitry for a variety of applications.

16 Claims, 17 Drawing Sheets

(56) References Cited

OTHER PUBLICATIONS

Dattoli, E. N., Wan, Q., Guo, W., Chen, Y. B., Pan, X. Q., Lu, W., Fully Transparent Thin-Film Transistor Devices Based on $SnO_2$ Nanowaires. *Nano Lett.* 2007, 7, 2463-2469.
Dimitrakopoulos, C. D., Malenfant, P. R. L., Organic Thin Film Transistors for Large Area Electronics. *Adv. Mater.* 2002, 14, 99-117.
Dodabalapur, A., Organic and Polymer Transistors for Electronics. *Materials Today* 2006, 9, 24-30.
Durkop, T., Getty, S. A., Cohas, E., Fuhrer, M. S., Extraordinary Mobility in Semiconducting Carbon Nanotubes. *Nano Lett.* 2004, 4, 35-39.
Forrest, S. R., The Path to Ubiquitous and Low-Cost Organic Electronic Appliances on Plastic. *Nature* 2004, 428, 911-918.
Fortunato, E. M. C., Barquinha, P. M. C., Pimentel, A. C. M. B. G., Goncalves, A. M. F., Marques, A. J. S., Pereira, L. M. N., Martins, R. F. P., Fully Transparent ZnO Thin-Film Transistor Produced at Room Temperature. *Adv. Mater.* 2005, 17, 590-594.
Garnier, F., Hajlaoui, R., Yassar, A., Srivastava, P., All-Polymer Field-Effect Transistor Realized by Printing Techniques. *Science* 1994, 265, 1684-1686.
Gelinck, G. H., Huitema, H. E. A., Van Veenendaal, E., Cantatore, E., Schrijnemakers, L., Van der Putten, J. B. P. H., Geuns, T. C. T., Beenhakkers, M., Giesbers, J. B., Huisman, B. H., et al., Flexible Active-Matrix Displays and Shift Registers Based on Solution-Processed Organic Transistors. *Nat. Mater.* 2004, 3, 106-110.
Gorrn, P., Sander, M., Meyer, J., Kroger, M., Becker, E., Johannes, H. H., Kowalsky, W., Riedl, T., Towards See-Through Displays: Fully Transparent Thin-Film Transistors Driving Transparent Organic Light-Emitting Diodes. *Adv. Mater.* 2006, 18, 738-741.
Han, S., Liu, X. L., Zhou, C. W., Template-Free Directional Growth of Single-Walled Carbon Nanotubes on a- and r-plane Sapphire. *J. Am. Chem. Soc.* 2005, 127, 5294-5295.
Hur, S.H., Park, O.O., Rogers, J.A., Extreme bendability of single-walled carbon nanotube networks transferred from high-temperature growth substrates to plastic and their use in thin-film transistors. *Appl. Phys. Lett.* 2005, 86, 243502.
Ju, S. Y., Facchetti, A., Xuan, Y., Liu, J., Ishikawa, F., Ye, P. D., Zhou, C. W., Marks, T. J., Janes, D. B., Fabrication of Fully Transparent Nanowire Transistors for Transparent and Flexible Electronics. *Nat. Nanotechnol.* 2007, 2, 378-384.
Kang, S. J., Kocabas, C., Ozel, T., Shim, M., Pimparkar, N., Alam, M. A., Rotkin, S. V., Rogers, J. A., High-Performance Electronics Using Dense, Perfectly Aligned Arrays of Single-Walled Carbon Nanotubes. *Nat. Nanotechnol.* 2007, 2, 230-236.
Kim, S., Ju, S., Back, J.H., Xuan, Y., Ye, M.S., Janes, D.B., Mohammadi, S., Fully Transparant Thin-Film Transistors Based on Aligned Carbon Nanotube Arrays and Indium Tin Oxide Electrodes. *Adv. Mater.* 2009, 21, 564-568.
Kobayashi, S., Nonomura, S., Ohmori, T., Abe, K., Hirata, S., Uno, T., Gotoh, T., Nitta, S., Kobayashi, S., Optical and Electrical Properties of Amorphous and Microcrystalline GaN Films and Their Application to Transparent TFT. *Appl. Surf. Sci.* 1997, 114, 480-484.
Ltu, P., Sun, Q., Zhu, F., Liu, K., Jiang, K., Liu, L., Li, Q., Fan, S., Measuring the Work Function of Carbon Nanotubes with Thermionic Method. *Nano Lett.* 2008, 8, 647-651.
Martel, R., Schmidt, T., Shea, H. R., Hertel, T., Avouris, P., Single- and Multi-Wall Carbon Nanotube Field-Effect Transistors. *Appl. Phys. Lett.* 1998, 73, 2447-2449.
Nomura, K., Ohta, H., Takagi, A., Kamiya, T., Hirano, M., Hosono, H., Room-Temperature Fabrication of Transparent Flexible Thin-Film Transistors Using Amorphous Oxide Semiconductors. *Nature* 2004, 432, 488-492.
Nomura, K., Ohta, H., Ueda, K., Kamiya, T., Hirano, M., Hosono, H., Thin-Film Transistor Fabricated in Single-Crystalline Transparent Oxide Semiconductor. *Science* 2003, 300, 1269-1272.
Presley, R. E., Hong, D., Chiang, H. Q., Hung, C. M., Hoffman, R. L., Wager, J. F., Transparent Ring Oscillator Based on Indium Gallium Oxide Thin-Film Transistors. *Solid-State Electron.* 2006. 50, 500-503.
Riviere, J. C., Work Function of Gold. *Appl. Phys. Lett.* 1966, 8, 172.
Rogers, J. A., Bao, Z., Baldwin, K., Dodabalapur, A., Crone, B., Raju, V. R., Kuck, V., Katz, H., Amundson, K., Ewing, J., Drzaic, P., Paper-like Electronic Displays: Large-Area Rubber-Stamped Plastic Sheets of Electronics and Microencapsulated Electrophoretic Inks. *Proc. Natl. Acad. Sci. U. S. A.* 2001, 98, 4835-4840.
Rosenblatt, S., Yaish, Y., Park, J., Gore, J., Sazonova, V., McEuen, P. L., High Performance Electrolyte Gated Carbon Nanotube Transistors. *Nano Lett.* 2002, 2, 869-872.
Shim, M., Javey, A., Kam, N. W. S., Dai, H. J., Polymer Functionalization for Air-Stable n-type Carbon Nanotube Field-Effect Transistors. *J. Am. Chem. Soc.* 2001, 123, 11512-11513.
Shiraishi, M., Ata, M., Work Function of Carbon Nanotubes. *Carbon* 2001, 39, 1913-1917.
Someya, T., Kato, Y., Sekitani, T., Iba, S., Noguchi, Y., Murase, Y., Kawaguchi, H., Sakurai, T., Conformable, Flexible, Large-Area Networks of Pressure and Thermal Sensors with Organic Transistor Active Matrixes. *Proc. Natl. Acad. Sci. U. S. A.* 2005, 102, 12321-12325.
Song, W., So, S. K., Cao, L., Angular-Dependent Photoemission Studies of Indium Tin Oxide Surfaces. *Appl. Phys. A:Mater. Sci. Process.* 2001, 72, 361-365.
Takenobu, T., Takahashi, T., Kanbara, T., Tsukagoshi, K., Aoyagi, Y., Iwasa, Y., High-Performance Transparent Flexible Transistors Using Carbon Nanotube Films. *Appl. Phys. Lett.* 2006, 88, 33511-33513.
Tans, S. J., Verschueren, A. R. M., Dekker, C., Room-Temperature Transistor Based on a Single Carbon Nanotube. *Nature* 1998, 393, 49-52.
Thomas, G., Materials science—Invisible circuits. *Nature* 1997, 389, 907-908.
Thostenson, E. T., Ren, Z. F., Chou, T. W., Advances in The Science and Technology of Carbon Nanotubes and Their Composites: a review. *Compos. Sci. Technol.* 2001, 61, 1899-1912.
Wang, L., Yoon, M. H., Lu, G., Yang, Y., Facchetti, A., Marks, T. J., High-Performance Transparent Inorganic-Organic Hybrid Thin-Film n-type Transistors. *Nat. Mater.* 2006, 5, 893-900.

\* cited by examiner

300

300

310

310

TRANSPARENT ELECTRONICS BASED ON TRANSFER PRINTED CARBON NANOTUBES ON RIGID AND FLEXIBLE SUBSTRATES

CROSS-REFERENCE TO RELATED APPLICATION

This application claims the benefit of U.S. 61/117,519, filed on Nov. 24, 2008, which is hereby incorporated by reference in its entirety (including all tables, figures, and other associated data).

The subject invention was made with government support under Grant Nos. CCF-0726815 and CCF-0702204 awarded by the National Science Foundation and Contract No. 2003-NT-1107 awarded by the Center on Functional Engineered and Nano Architectonics. The government has certain rights in the invention.

BACKGROUND OF THE INVENTION

Transparent electronics is an emerging technology for the realization of invisible devices and circuits for the next generation of optoelectronic devices and other electronics involving printing, large areas, low cost, flexibility, wearability, and fashion and design Central to the realization of transparent electronics is the development of transparent thin-film transistors (TTFTs). Of interest to current research are the performance metrics including high device mobility and low temperature fabrication. Generally, high device mobility enables fast device operation and low power consumption, which broadens the application area of TTFTs. The low temperature fabrication of transparent devices on flexible substrates enables emerging applications such as e-paper, wearable displays, smart tags, and artificial skin "e-skin." Low temperature fabrication of TTFTs can also lower the fabrication expense.

Traditionally, wide band-gap semiconductors were studied for TTFTs, such as GaN and oxide semiconductor films. However, TTFTs fabricated in these cases usually exhibit rather moderate mobilities. For instance, reported TTFTs fabricated using In—Ga—Zn—O film have shown a device mobility of ~80 $cm^2V^{-1}s^{-1}$ on glass substrates and ~9 $cm^2V^{-1}s^{-1}$ on polyethylene terephthalate (PET) substrates. In addition reported TTFTs with $In_2O_3$ films coupled with an organic dielectric layer exhibited mobility of 120 $cm^2V^{-1}S^{-1}$ on glass substrates.

Recently, semiconductor nanowires have emerged as another class of materials that can be used to fabricate TTFTs. For example, transparent transistors using $In_2O_3$ nanowires have shown a mobility of 514 $cm^2V^{-1}s^{-1}$ (see "Fabrication of Fully Transparent Nanowire Transistors for Transparent and Flexible Electronics" by S.Y. Ju et al., Nat. Nanotechnol., vol. 2, pp 378-384, 2007)

Despite the above-mentioned success, the reported mobility values are still low compared to non-transparent devices, indicating further room for improvement.

In addition, the oxide based TTFTs have generally been limited to n-type transistors. Indeed, the development of high performance transparent p-type transistors, which is an essential element in CMOS, still remains a great challenge.

To realize high-performance p-type TTFTs with high mobility, single-walled carbon nanotubes (SWNTs) may be a promising candidate for their intrinsic mobility of over 100,000 $cm^2V^{-1}s^{-1}$, good mechanical flexibility, and good optical transparency. In addition, carbon nanotube devices usually exhibit p-type transport behavior, which complements the n-type oxide-based TTFTs.

In recent years, random nanotube networks were used as active channels for TTFTs. However the best obtained mobility was reported to be ~30 $cm^2V^{-1}s^{-1}$.

Thus, research continues to be conducted in order to achieve elements not only capable of high device mobility and low temperature fabrication, but also capable of integration and complementary circuitry.

BRIEF SUMMARY OF THE INVENTION

Embodiments of the present invention provide methods and devices for transparent electronics. According to an embodiment, transparent electronics are provided based on transfer printed aligned carbon nanotubes. The aligned carbon nanotubes-based transparent electronics can be disposed on both rigid and flexible substrates. Methods are provided to enable highly aligned single-walled carbon nanotubes (SWNTs) to be used in transparent electronics for achieving high carrier mobility while using low-temperature processing.

According to certain embodiments, TTFTs are provided made with aligned SWNTs. P-type and N-type devices are disclosed. The subject devices can be integrated to provide logic gates and analog circuitry for a variety of applications.

In one embodiment, a method is provided including: growing highly aligned nanotubes on a first substrate; transferring the aligned nanotubes to a rigid or flexible substrate having pre-patterned gate electrodes; and forming source and drain electrodes on the transferred nanotubes. In a further embodiment, a gate dielectric can be formed on the pre-patterned gate electrodes before transferring the aligned nanotubes onto the rigid or flexible substrate. Yet further embodiments incorporate ohmic contacts for the source and drain electrodes. In a specific embodiment, the ohmic contacts are formed of gold or palladium.

The use of massively aligned nanotubes in accordance with embodiments of the present invention enables devices to exhibit high performance, including high mobility, good transparency, and mechanical flexibility. In addition, the subject aligned nanotube transistors can be easy to fabricate and integrate, as compared to individual nanotube devices. The transfer printing process performed in accordance with embodiments of the present invention allows devices to be fabricated through a low temperature process, which is particularly useful for realizing transparent electronics on flexible substrates.

The details of one or more embodiments are set forth in the accompanying drawings and the description below. Other features will be apparent from the description, drawings, and claims.

BRIEF DESCRIPTION OF THE DRAWINGS

FIG. 3A shows a series of SEM images of aligned nanotubes where the second layer was placed perpendicular to the first layer; FIG. 3B shows a series of SEM images of aligned nanotubes where the second layer was placed with 60° angle to the first layer;

FIG. 3C shows a SEM image of aligned nanotubes after a second parallel transfer; and FIG. 3D shows a SEM image of aligned nanotubes after a third parallel el transfer.

FIG. 4A shows a schematic diagram of a transfer aligned carbon nanotube transparent device on a substrate according to an embodiment of the present invention; FIGS. 4B and 4C show a side view and a top view, respectively, of a bottom gated transparent transistor structure with aligned nanotubes as the channel; and FIGS. 4D and 4E show a side view and a top view, respectively, of a top gated transparent transistor structure with aligned nanotubes as the channel.

FIG. 7A shows a circuit diagram of a LED driven by a transparent SWNT transistor; FIG. 7B shows a plot of the output current through the LED ($I_{LED}$) versus $V_{in}$ with $V_{DD}$=9 V. e; FIG. 7C shows plots of LED light intensity versus $V_{in}$ in linear (left axis of FIG. 7C) and log (right axis of FIG. 7C) scale, respectively, with $V_{DD}$=9 V; and FIG. 7D shows optical images of the LED under $V_{in}$=30 V, 0 V, and −30 V.

FIG. 8A shows a SEM image of transferred aligned SWNTs on SU-8 on a glass substrate; FIG. 8B shows a SEM image of devices showing the ITO source and drain electrodes fabricated on glass—the inset shows a SEM image of aligned nanotubes bridging the ITO electrodes; FIG. 8C shows an optical micrograph of fully transparent aligned SWNT transistors on a 4-inch glass wafer; and FIGS. 8D and 8E show optical micrographs of fully transparent aligned SWNT transistors on a PET sheet of 3" by 4".

FIG. 9A shows a plot of optical transmittance of glass substrates with arrays of transparent aligned SWNT transistors with Au/ITO and ITO contacts; FIG. 9B shows $I_{ds}$-$V_{ds}$ curves of a 100 μm wide and 50 μm long aligned SWNT transistor with Au/ITO contact under different $V_g$ from −20 V to 20 V with a step of 5 V; FIG. 9C shows $I_{ds}$-$V_g$ curves of the same device under different $V_{ds}$ from 0.1 to 1.0 V with a step of 0.1 V; FIG. 9D shows plots of $I_{ds}$ (left axis) and transconductance (right axis) versus $V_g$ for the same device; FIG. 9E shows mobility versus channel length for aligned SWNT transistors with Au/ITO contacts and channel width of 200 μm; FIG. 9F shows a plot of the mobilities of transparent transistors reported in the literature; FIG. 9G shows $I_{ds}$-$V_{ds}$ plots for devices having Au/ITO (left axis) and ITO (right axis) contacts under $V_g$=0 V; FIG. 9H shows $I_{ds}$-$V_{ds}$ curves of an aligned SWNT transistor with ITO contacts where $V_g$ varied from −10 V to 10 V at a step of 5 V (from top to bottom); and FIG. 9I shows an $I_{ds}$-$V_g$ curve of the same device in log scale with $V_{ds}$=0.5 V.

FIG. 10A shows a plot of optical transmittance of a PET substrate with arrays of transparent aligned SWNT transistors with ITO contacts—and inset showing an optical micrograph of a piece of PET sheet with aligned nanotube TTFTs; FIG. 10B shows $I_{ds}$-$V_g$ curves of a representative device under different bending angles; FIG. 10C shows on-current (right axis) and transconductance (left axis) extracted from the data in FIG. 10B versus bending angle; and FIG. 10D shows $I_{ds}$-$V_{ds}$ curves of a fully transparent flexible aligned SWNT transistor under different $V_g$ with bending of the substrate by 90° where $V_g$ was swept from 6 V (top curve) to 20 V (bottom curve) with a step of 2 V.

FIG. 11A shows transmittance of the devices on glass after PEI coating; FIG. 11B shows Ids–Vg curves under different gate voltage with a step of 0.5 V; and FIG. 11C shows the Ids–Vg characteristics of the device after PEI coating.

FIG. 12A shows SEM images of CNT network prepared by solution casting; FIG. 12B shows SEM images of CNT network prepared by CVD; FIG. 12C shows an optical micrograph of density gradient column with CNTs; and FIG. 12D shows a plot of the absorption spectrum of samples with enriched semiconductive and metallic nanotubes by density gradient.

FIGS. 13A and 13B show a side view and a top view, respectively, of a bottom gated transparent transistor structure with random network nanotubes as the channel; and FIGS. 13C and 13D show a side view and a top view, respectively, of a top gated transparent transistor structure with random network nanotubes as the channel,

DETAILED DESCRIPTION OF THE INVENTION

Embodiments of the present invention provide transparent electronics based on transfer printed carbon nanotubes. The subject methods and devices can be used to provide transparent circuits and devices on rigid and flexible substrates. Transparent electronic devices fabricated in accordance with embodiments of the present invention can be provided for a variety of applications including those relying on flexible substrates for wearable, handheld, portable consumer electronics as well as the compatibility with roll-to-roll fabrication.

Figure 1A:
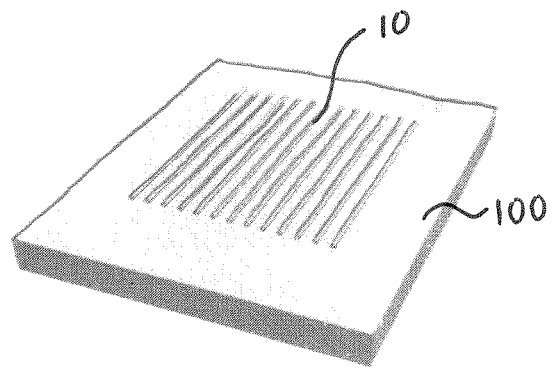
FIGS. 1A-1E show exploded and fold-away views for explaining a fabrication process of fully transparent aligned SWNT transistors in accordance with an embodiment of the present invention.

According to certain embodiments of the present invention, a transfer printing method can be utilized to fabricate aligned nanotube, transparent transistors. Referring to FIG. 1A, nanotubes 10 can be grown on a first substrate 100. The nanotubes 10 can be grown using processes capable of creating aligned structures. In a specific embodiment, single walled carbon nanotubes (SWNTs) can be grown on the first substrate 100 using chemical vapor deposition (CVD) under conditions capable of achieving alignment of the SWNTs. For example, an electric field or gas flow control may be used to align the SWNTs or a "fast heating" CVD method may be used. Alternatively, or in addition, patterned catalysts (see e.g., FIG. 8A) on the substrate may be used to aid in aligning the SWNTs. The first substrate 100 can be a single-crystal substrate, such as sapphire or quartz.

Figure 1B:
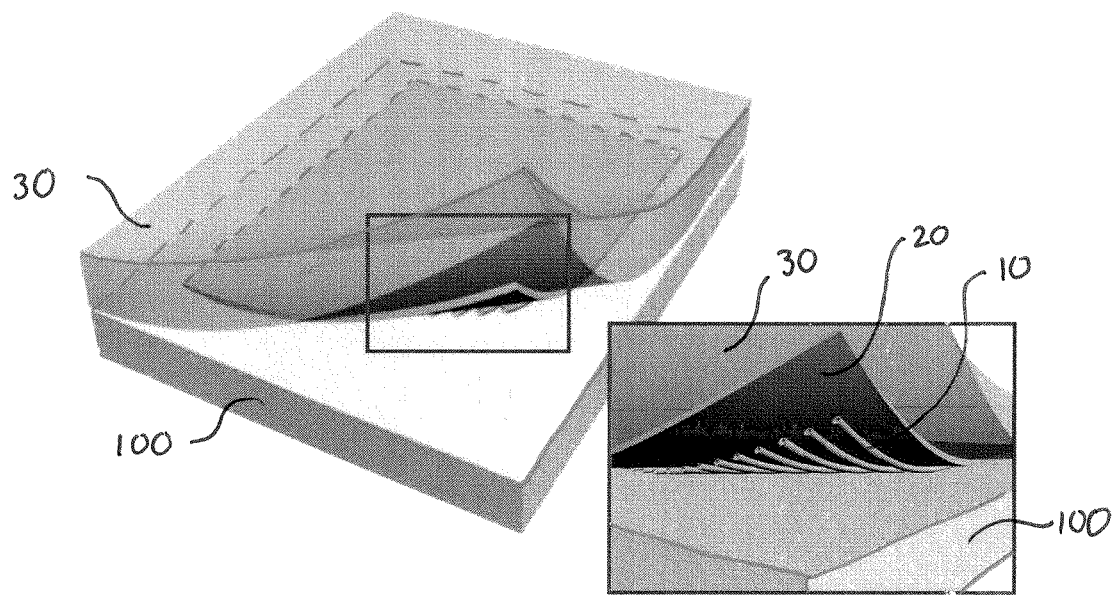

After growing the aligned nanotubes 10 on the first substrate 100, a transfer process performed in accordance with certain embodiments of the present invention can begin. Referring to FIG. 1B, a conformal film 20 can be coated on the aligned nanotubes 10 on the first substrate 100. The conformal film 20 is formed of a material that can coat the nanotubes 10 and also be easily removed in a subsequent process without excessive damage to the nanotubes. In a preferred embodiment, the conformal film 20 is a gold film, but embodiments are not limited thereto. For example, plastic films such as poly(methyl methacrylate) (PMMA), and other metal films such as Al, Pt, Cu, and Pd may be used. The conformal film 20 can be in the range of tens to hundreds of nanometers thick. In one embodiment, the conformal film 20 can be about 80 to 120 nm thick. In a specific embodiment, the conformal film 20 can be about 100 nm thick.

After coating the nanotubes 10 with, for example, a gold film 20, an adhesive 30 can be placed on the gold film 20. In preferred embodiments, the adhesive 30 is a material that has adhesive characteristics at room temperature, but loses adhesion at higher temperatures. For example, the adhesive 30 can be provided as a thermal tape that loses adhesion above 120° C. By using an adhesive such as a thermal tape, the transfer mechanism can be easily and quickly removed, avoiding residues that may remain when removing a melted polymer.

To initiate the transfer from the first substrate 100 to the receiving substrate, the adhesive tape 30 can be peeled slowly back from the first substrate 100, taking the nanotube/conformal film (10/20) from the first substrate 100 as shown in the enlarged box in FIG. 1B. The adhesive tape 30 then carries the conformal film and aligned SWNTs, leaving the first substrate 100 stripped of the aligned SWNTs. The use of the conformal film 20 improves adhesion between the adhesive tap 30 and the nanotubes 10, aiding in the transfer process.

The receiving substrate can be prepared to receive the SWNTs. The receiving substrate can be a rigid or flexible substrate. According to some embodiments the receiving substrate can be a glass substrate or a plastic-based transparent substrate. For example, the receiving substrate can be, but is not limited to, glass, quartz, sapphire, poly(ethylene terephthalate) (PET), polyethylene naphthalate (PEN), polyester (PE), and poly(etheretherketone) (PEEK). In one embodiment, the receiving substrate can include a transparent conductive film (201) for providing a back gate and a dielectric layer (202) formed thereon. The transparent conductive film for the back gate may be pre-patterned using known processes according to gate layout for the final circuit structure. According to certain embodiments, the transparent conductive film for the gate electrode can be a transparent conductive oxide (TCO), including but not limited to doped and undoped metal oxides such as indium tin oxide (ITO), indium tungsten oxide (IWO), aluminum zinc oxide (AZO), indium zinc oxide (IZO), indium oxide, and zinc oxide. The dielectric can be one or more thin and/or high-k dielectrics, such as HfO or self-assembled organic nano-dielectrics (SAND). The dielectric can be an inorganic or organic composition, including one or more transparent metal oxides, silicon-oxygen and carbon-oxygen compositions, or polymers. For example, a polymeric resin such as SU-8, used in photolithography processes, can be used as the dielectric layer. Other examples include poly (4-vinylphenol) (PVP), poly(2-vinylphenol) (PVN), polystyrene (PS), poly(vinylalcohol) (PVA), PMMA, polyimide, and crosslinked polymer blend dielectric (CPS). In one embodiment, such as illustrated in the examples, the back gate can be formed of ITO and the dielectric layer can be formed of cured SU-8.

As further described in the examples, device performance can be improved by using high-k dielectrics or SAND, which results in reduced operating voltage as compared to using SU-8.

Figure 1C:
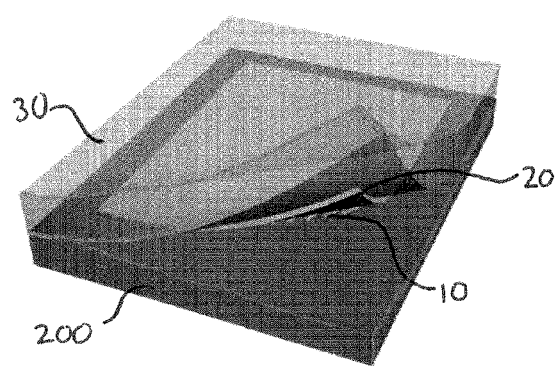
Figure 1D:
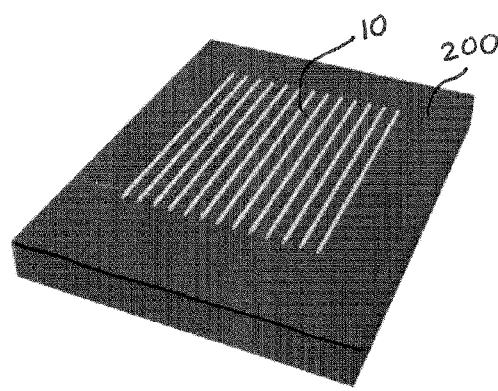

Referring to FIG. 1C, the adhesive tape 30 having the conformal film/aligned SWNTs (20/10) can be placed on a receiving substrate 200 and then heated to cause the adhesive tape 30 to lose adhesion. For example, the receiving substrate 200 having a transparent conductive film, dielectric layer, and adhesive tape/conformal film/aligned SWNTs (30/20/10) can be placed on a hot plate and heated above the temperature sufficient to cause the adhesive tape 30 to lose adhesion. Referring to FIG. 1D, once the adhesive tape 30 loses adhesion, the tape can be removed, leaving the SWNTs 10 and conformal film 20 on the receiving substrate 200. Then, the conformal film 20 can be removed by etchant, leaving the aligned SWNTs 10 on the receiving substrate 200. When the conformal film 20 is a gold film, gold etchant can be used.

Figure 1E:
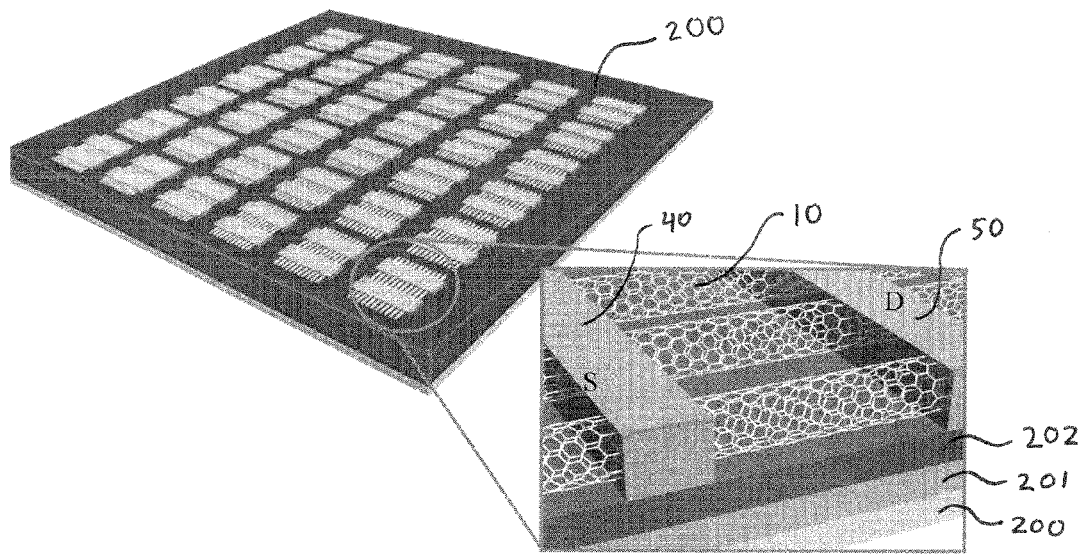

Referring to FIG. 1E, source and drain electrodes 40, 50 can be formed on the SWNTs 10. In one embodiment, photolithography can be used to define openings for the source and drain electrodes 40, 50 and then conductive material can be deposited on the structure. The source and drain electrodes 40, 50 can be formed of any suitable transparent conductive material(s). For example, the source and drain electrodes can include one or more TCOs. In a further embodiment, ohmic contacts can be included as part of the source and drain electrodes. For example, a thin gold or palladium film can be deposited on the nanotubes before depositing the material for the source and drain electrodes.

The carbon nanotubes can also be etched to remove unwanted portions such as in regions outside the channels of the transistors. The break-out box in FIG. 1E shows the aligned SWNT transistor device structure, which includes a substrate 200, back gate 201, dielectric 202, aligned SWNTs 10 for the channel, and source and drain electrodes 40, 50.

Figure 2:
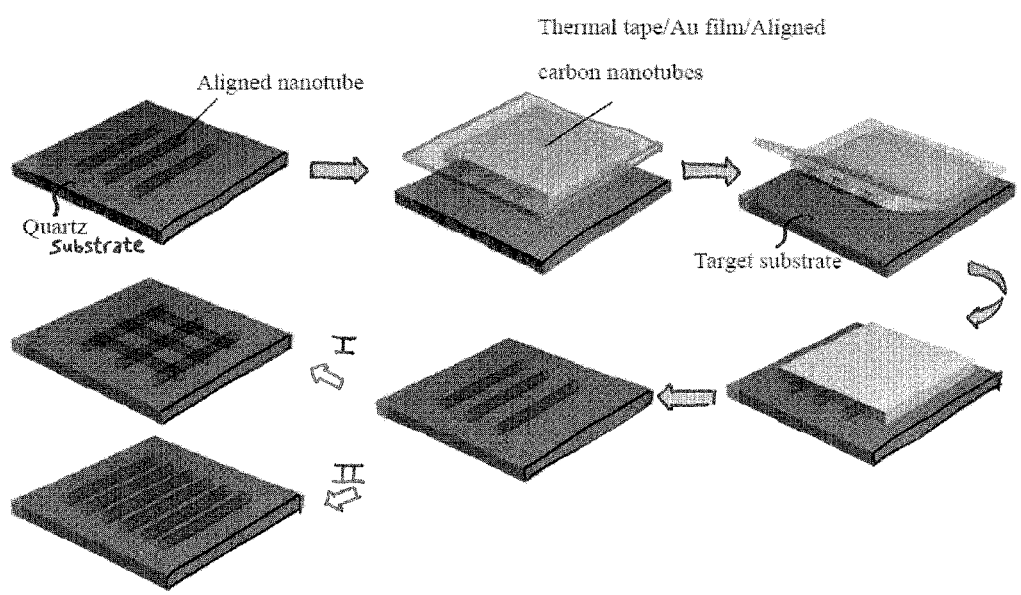
FIG. 2 shows a schematic diagram of a multiple transfer of aligned carbon nanotubes in accordance with certain embodiments of the present invention.

The transferring process from a first substrate to the receiving substrate can be repeated to transfer multiple layers of aligned nanotubes. The multiple layers of aligned nanotubes can be arranged to obtain sophisticated nanotube networks, or textures. FIG. 2 shows a schematic diagram of a multiple transfer of aligned carbon nanotubes in accordance with certain embodiments of the present invention. Each transfer can be conducted in accordance with the method steps described in reference to FIGS. 1A-1D. For example, as shown in FIG. 2, aligned nanotubes can be grown on a quartz substrate, a gold film can be coated on the as-grown nanotubes, and an adhesive tape can be used to adhere to the gold film in order to peel off the aligned nanotubes from the quartz substrate. The adhesive tape with gold film and carbon nanotubes can be placed on a target substrate, and the adhesive tape and gold film can be removed to leave the carbon nanotubes on the target substrate. After the first layer of aligned nanotubes is provided on the target substrate, additional layers can be added following the same transfer steps. In certain embodiments such as shown in path I, the second layer of aligned nanotubes is placed orthogonal to the first layer. Angles other than 90° can also be implemented. In other embodiments such as shown in path II, the second layer is placed parallel to the first layer. Placing the second layer parallel to the first layer can result in increasing the density of carbon nanotubes. Accordingly, a combination of parallel and angled placement can be utilized to achieve desired textures.

Figure 3A:
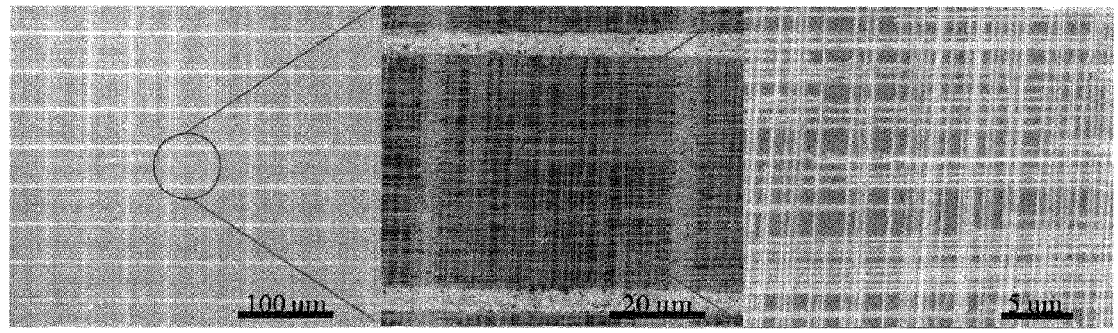
FIGS. 3A-3D show scanning electron microscope (SEM) images of aligned nanotubes after multiple transfer in accordance with embodiments of the present invention.
Figure 3B:
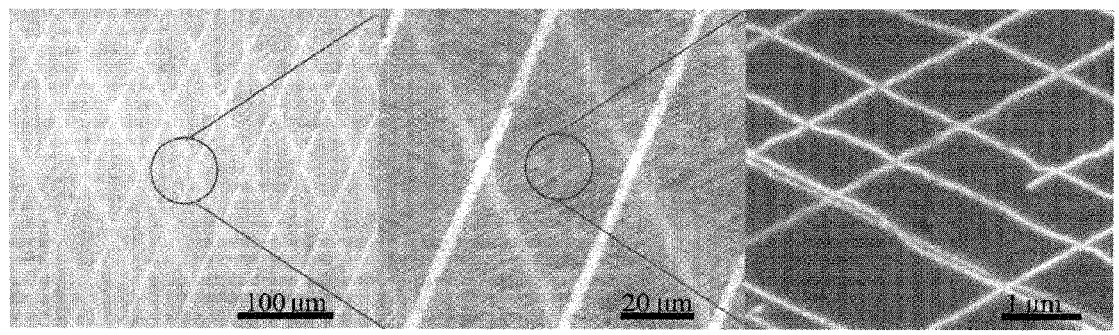
Figure 3C:
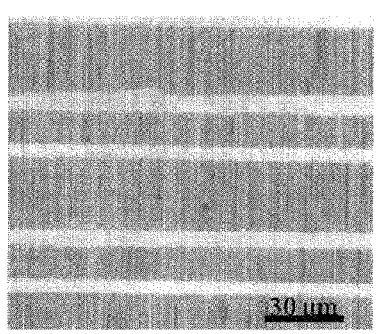
Figure 3D:
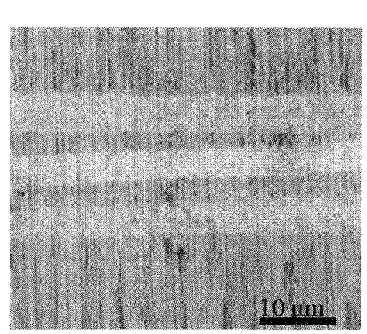
Figure 3E:
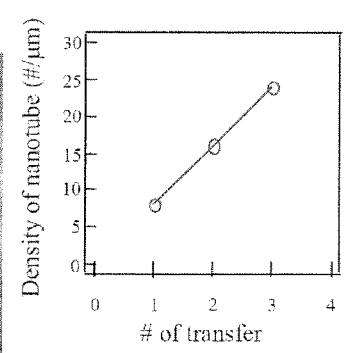
FIG. 3E shows a plot of the density of nanotubes (# of SWNT/μm) versus number of parallel transfers.

FIG. 3A shows actual SEM images at different magnifications of a nanotube network with the second layer of nanotubes transferred orthogonal to the first layer fabricated as described in reference to path I, and FIG. 3B shows SEM images of nanotubes transferred with 60° angle angular alignment. Furthermore, by transferring multiple layers of nanotubes in parallel orientation as described in reference to path II, the density of aligned nanotubes can be increased. For example, FIGS. 3C and 3D show the SEM images of aligned nanotubes with two-step and three-step transfer, respectively. As illustrated in the plot of FIG. 3E, the nanotube density exhibited a linear increase from 7 to 25 nanotubes. In one embodiment, an exponential increase in nanotube density can be accomplished by starting with nanotube samples with a density of n nanotubes per micron, performing one round of transfer to obtain multiple samples with 2n nanotubes per micron, and then performing another step of transfer to obtain samples with 4n nanotubes per micron.

Figure 4A:
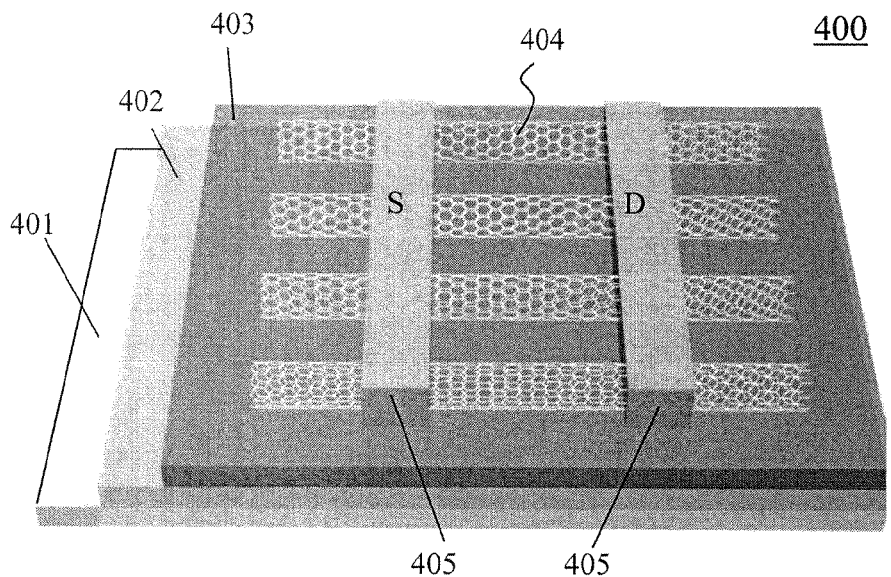
FIGS. 4A-4E show device structures with aligned nanotubes as the channel in accordance with certain embodiments of the present invention.

FIG. 4A shows a schematic diagram of a transfer aligned carbon nanotube transparent device 400 on a substrate 401 according to an embodiment of the present invention. In particular, the device 400 can include a back gate 402 and a gate dielectric 403 on the substrate 401. Transfer aligned carbon nanotubes 404 can be provided on the gate dielectric 403 and source and drain electrodes 405 can be formed on the carbon nanotubes 404.

Figure 4B:
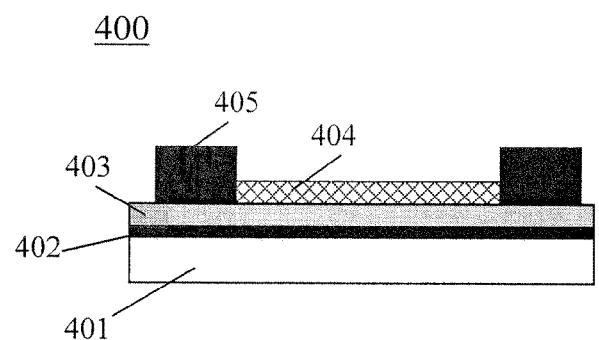
Figure 4C:
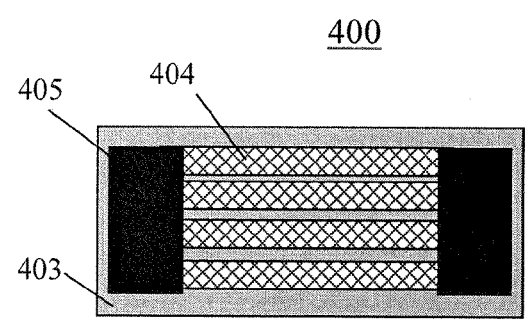
Figure 4D:
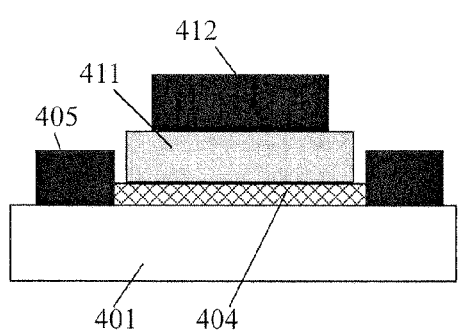
Figure 4E:
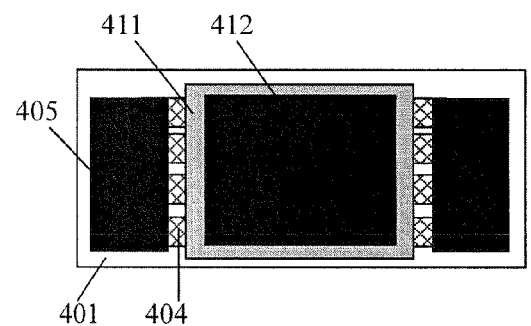

Referring to FIGS. 4B-4E, a variety of transparent transistor structures using aligned carbon nanotubes for the channel region can be provided. FIGS. 4B and 4C show a bottom gated transparent transistor structure having a gate electrode 402 on a substrate 401, a gate dielectric 403 on the gate electrode 402, aligned nanotubes 404 on the gate dielectric 403 and source and drain electrodes 405 at opposite ends of a channel provided by the aligned nanotubes 404. In one embodiment, a similar structure can be used as a transparent sensor for sensing applications. FIGS. 4D and 4E show a top gated transparent transistor structure having aligned nanotubes 404 disposed on the substrate 401, source and drain electrodes 405 at opposite ends of a channel provided by the aligned nanotubes 404, a gate dielectric 411 on the aligned nanotubes 404 between the source and drain electrodes 405, and a gate electrode 412 on the gate dielectric 411.

The gate electrodes 402 and 412 may be formed of any suitable material. For transparent electronic applications, the gate electrodes can be formed of a TCO, including but not limited to doped and undoped metal oxides such as ITO, IWO, AZO, IZO, indium oxide, and zinc oxide. The gate dielectric 403 and 411 can be one or more thin and/or high-k dielectrics. For example, the gate dielectric 403 and 411 can be a polymer dielectric such as SU8, PVP, PVN, PMS, PS, PVA, PMMA, polyimide, or CPD; an oxide (or nitride) dielectric such as SiN, $SiO_2$, $Al_2O_3$, or HfO; or an organic dielectric such as SAND. The source and drain electrodes 405 can be formed of any suitable material. For example, for transparent electronic applications, the source and drain electrodes 405 can include a same transparent conductive material as the gate electrode 401 and 411 or a different type of transparent conductive material. The transparent conductive material can include, but is not limited to doped and undoped metal oxides such as ITO, IWO, AZO, IZO, indium oxide, and zinc oxide. In a further embodiment, the source and drain electrodes can include an ohmic contact (not shown) between the nanotubes 404 and the source and drain electrodes 405. In another embodiment, the source and drain electrodes 405 can be provided as random networks of nanotubes on the aligned nanotubes 404. The random network of nanotubes can also be used as the source and drain electrodes for embodiments using bulk semiconductor-type nanotubes as the channel in place of the aligned nanotubes 404.

Figure 5A:
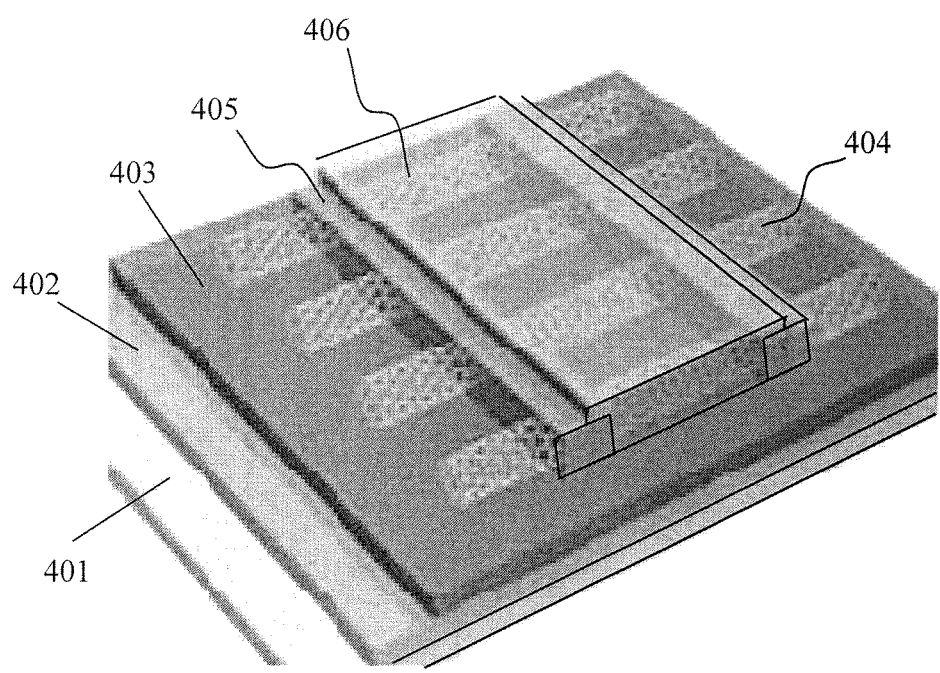
FIGS. 5A and 5B show a perspective view and a side view, respectively, of a transfer aligned carbon nanotube transparent device on a substrate incorporating a doped film on the carbon nanotubes according to an embodiment of the present invention.
Figure 5B:
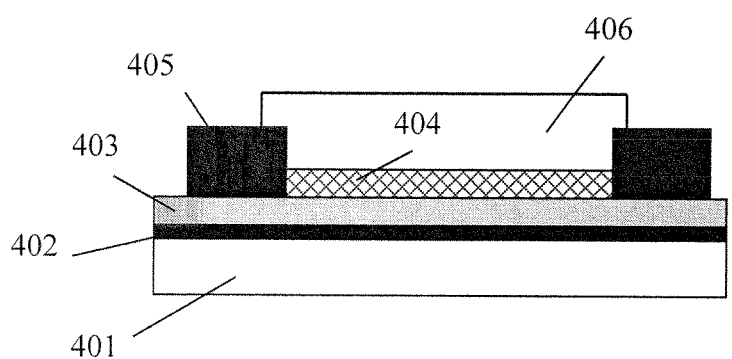

Because of the P-type functionality of the typical SWNT, P-type devices having the structure of device 400 can be provided without additional doping steps, but embodiments are not limited thereto. In certain embodiments, to provide an N-type device, the carbon nanotube transparent device of FIGS. 4A-4E can be doped to enhance the n-conduction of the devices. For example, as shown in FIGS. 5A and 5B, an N-type transistor 500 can be fabricated by coating the nanotubes 404 with polyethyleneimine (PEI) 406 to dope the devices with electrons.

According to embodiments of the present invention, the subject transfer printed aligned carbon nanotubes can provide transparent thin film transistor (TTFT) circuitry for many applications, including basic circuits and transparent displays. Applications of the subject transfer printed carbon nanotubes can include large integrated circuits covering, for example, a computer monitor, or a car or building window.

Figure 6A:
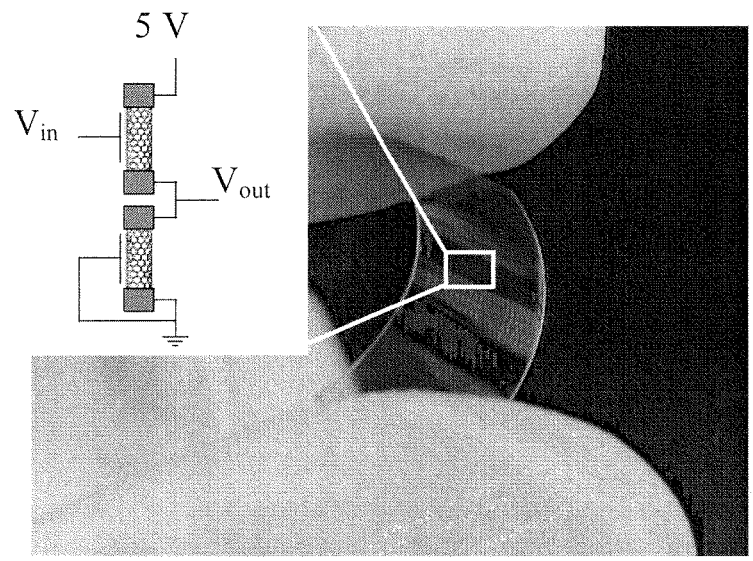
FIGS. 6A and 6B show a fully transparent logic gate on a flexible substrate fabricated in accordance with an embodiment of the present invention and plots of $V_{out}$ (left axis of FIG. 6B) and inverter gain (defined as $dV_{out}/dV_{in}$)(right axis of FIG. 6B) versus $V_{in}$ of a fully transparent flexible PMOS inverter, respectively

As one example such as the inverter shown in FIG. 6A, a fully transparent and flexible PMOS logic gate can be fabricated. The inverter schematic is shown as the inset in FIG. 6A. For the inverter, one aligned SWNT transistor with an individually addressable gate can be used as the drive, and another transistor with an individual back gate at a fixed gate voltage (here, $V_g$=0 V) can be used as the load. Though PMOS logic is shown, NMOS logic and CMOS logic are contemplated within the scope of this disclosure. In addition, the TTFT structure can be a top or a bottom gated structure in accordance with one or more embodiments of the present invention.

Figure 6B:
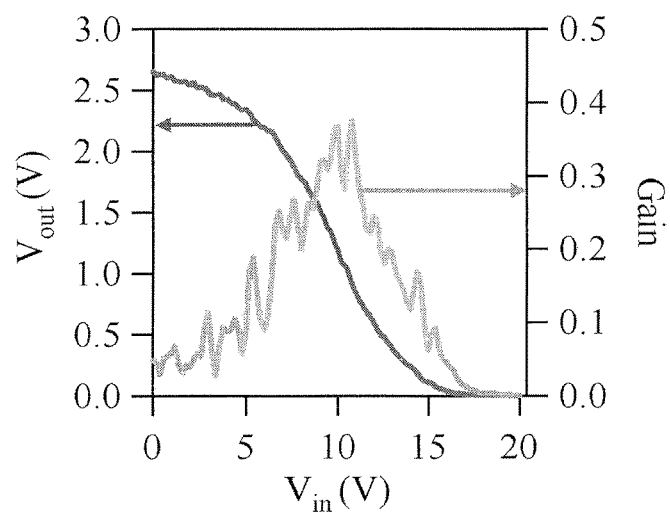

FIG. 6B shows characteristics of the inverter obtained from an example implementation fabricated as described with respect to EXAMPLE 1 below. The output voltage ($V_{out}$) of the inverter versus $V_{in}$ is shown with reference to the left axis and the gain defined as $dV_{out}/dV_{in}$ is shown with reference to the right axis. Referring to FIG. 6B, a maximum gain of ~0.38 was obtained at $V_{in}$=~12 V. This inverter gain is largely a consequence of the polymer dielectric used, and can be improved by using different dielectrics, such as high-k dielectric and/or thinner dielectric materials in place of the SU-8 of this example.

Figure 7A:
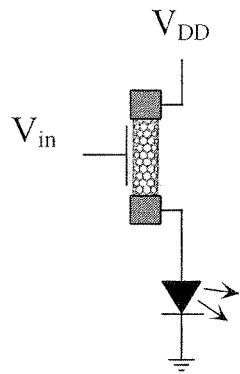
FIGS. 7A-7D show an application of fully transparent SWNT transistors for LED driving circuitry in accordance with an embodiment of the present invention.
Figure 7B:
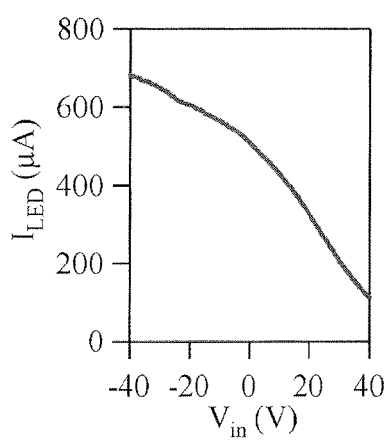
Figure 7C:
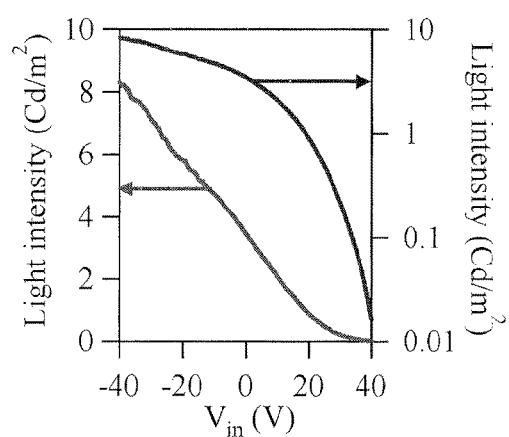

As another example, the subject transfer printed aligned carbon nanotubes can be part of control circuits for transparent displays. For example, the subject transistors can be used to control various light emitting devices. A simple example configuration is shown in FIG. 7A. Referring to FIG. 7A, one TTFT is shown connected to an LED. For illustrating characteristics of this configuration, an example implementation was provided using a transparent chip having transfer printed aligned carbon nanotubes fabricated as described with respect to EXAMPLE 1 below and a GaN LED that were wire-bonded on a breadboard. It should be noted that this example implementation is merely for illustrative purposes and should not be construed as limiting. For example, it is contemplated within the scope of this disclosure that the subject TTFTs can be integrated with one or more components of a transparent display. FIGS. 7B and 7C show characteristics of the LED control obtained from the example implementation.

Figure 7D:
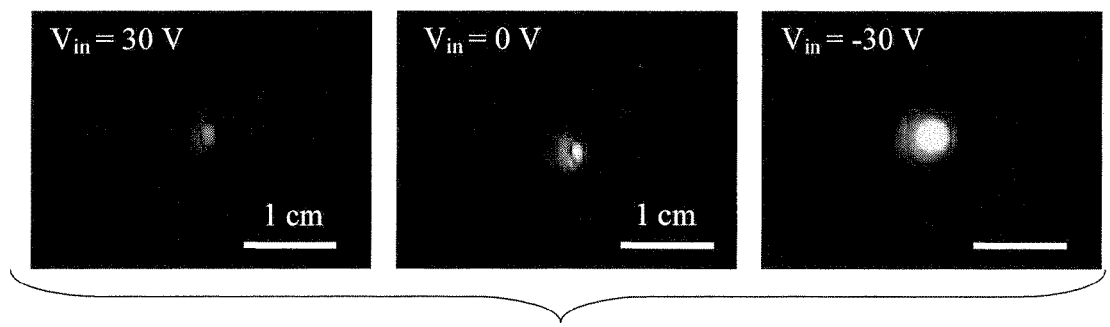

By controlling $V_{in}$, which was applied as the gate voltage for the transistor with fixed $V_{DD}$, the voltage drop across the LED can be controlled. FIG. 7B shows the current flowing through the LED, which was successfully modulated by $V_{in}$ by a factor of ~7. This modulation led to control of the LED light intensity as shown in FIG. 7C, where the light intensity was plotted against $V_{in}$ in linear (right axis) and in log (left axis) scale, respectively. Here, the ratio of the light intensity at the OFF-state and the ON-state reached ~$10^3$. FIG. 7D shows photographs of the LED operated with $V_{in}$=30 (left), 0 (middle), −30 (right) V, respectively, clearly showing the significant light intensity modulation.

Figure 12A:
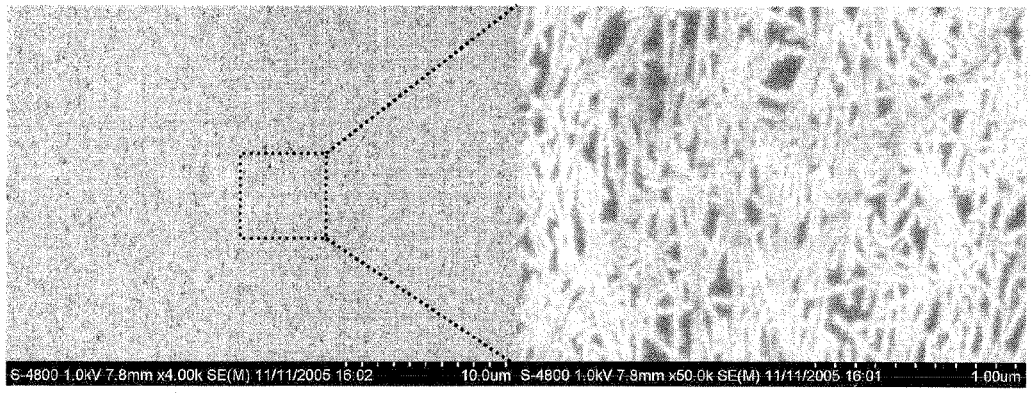
FIGS. 12A-12D illustrate carbon nanotube networks (CNTs) that can be utilized in accordance with further embodiments of the present invention.

Though embodiments have been described with respect to using aligned carbon nanotubes, the invention is not limited thereto. For example, random network nanotubes can be utilized for transparent electronics in accordance with certain embodiments of the present invention. In one embodiment, random networks of carbon nanotubes (CNTs) can be prepared by dispersing CNTs in solution and casting the CNTs on an appropriate substrate as shown in FIG. 12A. FIG. 12A shows typical SEM images of random network nanotubes deposited from bulk nanotubes. Bulk nanotubes are commercially available nanotubes, such as HiPco (high pressure CO conversion) nanotubes, arc-discharged nanotubes, and P3 nanotubes. Transparent transistors can be made using random network nanotubes deposited from bulk nanotubes. In one such embodiment, random network nanotubes are formed by dispersing nanotube suspensions made from bulk nanotubes. Transparent conductors can then be deposited as source and drain electrodes. A dielectric layer may be deposited on the random network nanotubes except on the contact pad regions of the electrodes, followed by deposition of a gate electrode made of transparent conductor.

The substrate may be the glass or plastic substrate having a gate electrode and gate dielectric as discussed above. The source and drain electrodes can include an ohmic contact of a thin layer of gold or palladium film.

Figure 12B:
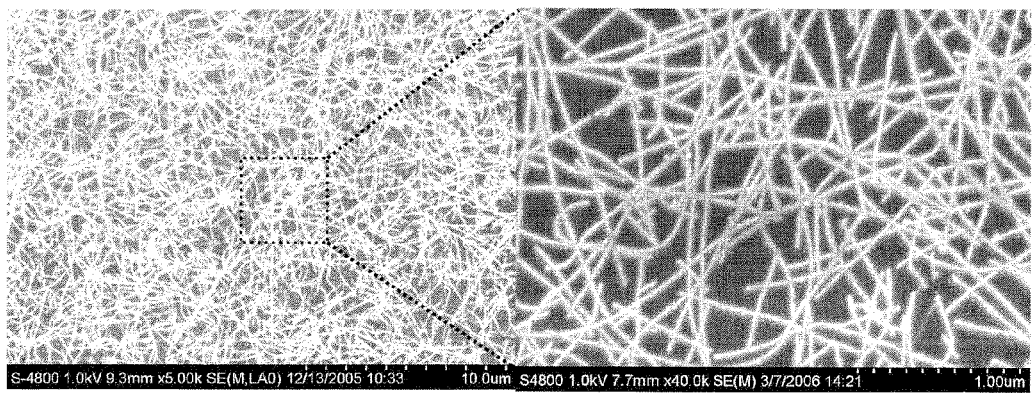

In another embodiment, a random CNT network can be grown using CVD process and then transferred onto an appropriate substrate. FIG. 12B shows typical SEM images of random network nanotubes grown by CVD. The transferring can be accomplished using for example, the above described transfer printing method. For example, random network nanotubes can be grown on a substrate using a CVD technique. The network can be transferred to a transparent substrate using same method as described with respect to the aligned nanotubes. Transparent conductors can be deposited as source and drain electrodes. In addition, depending on the application (such as those using top electrode transistor structures), a dielectric layer can be deposited on the transferred random network nanotubes except for on contact pad regions of the electrodes, followed by deposition of a gate electrode made of transparent conductor. Of course, embodiments are not limited thereto.

In yet another embodiment, separated CNTs can be prepared and then cast on an appropriate substrate. The CNTs can be separated according to type. That is, the CNTs can be separated according to semiconductor or metallic characteristics.

Transparent transistors can be made using separated nanotubes, which can improve fabrication cost and allows the use of printing technology. According to an embodiment, a nanotube network can be formed by dispersing separated nanotube suspensions. For example, separated semiconductor nanotubes can be deposited on a first substrate and then transferred to a target substrate, or deposited directly on a target substrate. Transparent conductors are then deposited as source and drain electrodes. The source and drain electrodes can include an ohmic contact of a thin layer of gold or palladium film. Depending on the application, a dielectric layer can be deposited on the separated semiconductor nanotubes, followed by deposition of a gate electrode made of transparent conductor. Of course, embodiments are not limited thereto.

Figure 12C:
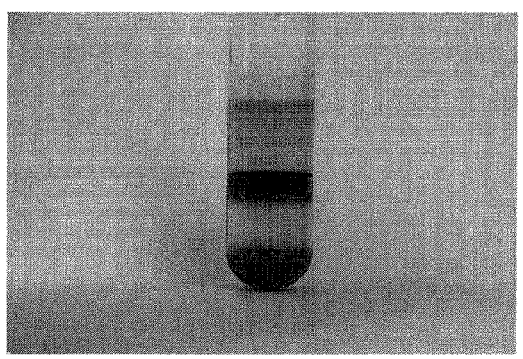
Figure 12D:
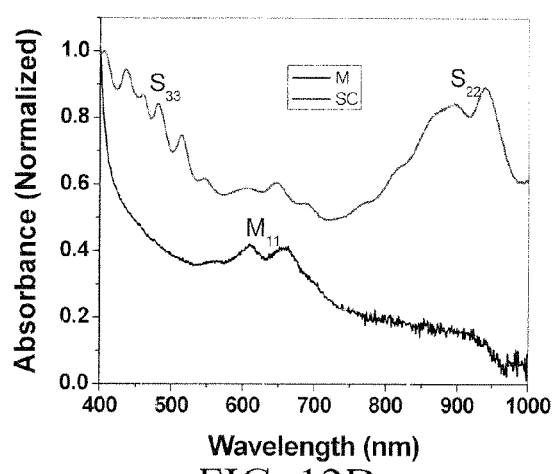

FIG. 12C shows an image of suspension of nanotubes after the separation treatment in a density gradient solvent, and FIG. 12D shows the absorption spectrum of nanotube suspensions where in one sample only semiconductor nanotubes can be found and in the other sample only metallic nanotubes can be found, indicating the successful separation.

Figure 13A:
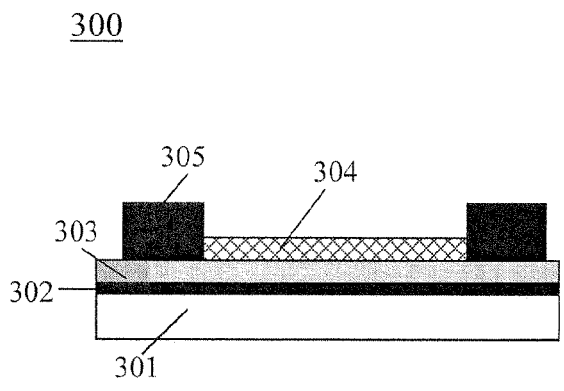
FIGS. 13A-13D show device structures with random network nanotubes as the channel in accordance with certain embodiments of the present invention.
Figure 13B:
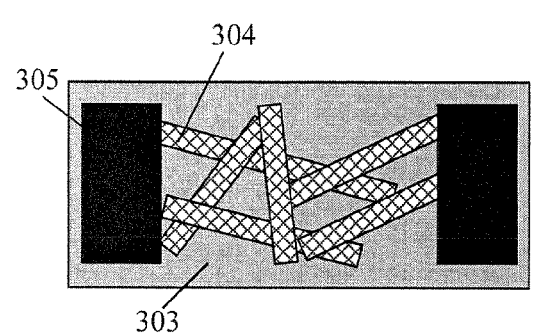
Figure 13C:
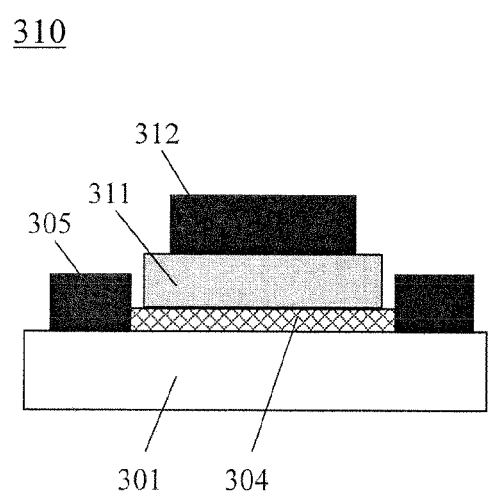
Figure 13D:
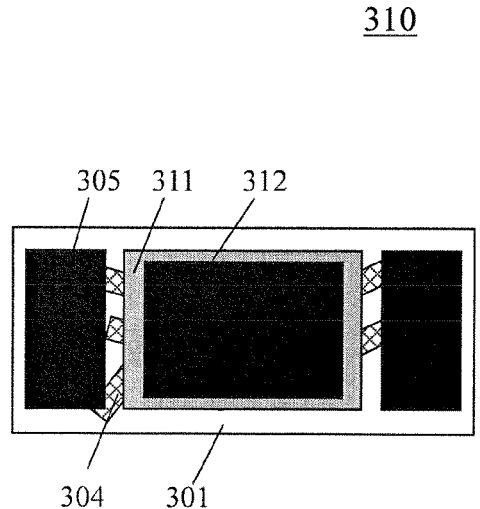

FIGS. 13A-13D show examples of TTFT structures having network nanotubes as the channel. FIGS. 13A and 13B show a bottom gated transparent transistor structure having a gate electrode 302 on a substrate 301, a gate dielectric 303 on the gate electrode 302, a nanotube channel 304 of networked nanotubes on the gate dielectric 303 and source and drain electrodes 305 at opposite ends of the channel 304 provided by the networked nanotubes. FIGS. 13C and 13D show a top gated transparent transistor structure having a networked nanotube channel 304 disposed on the substrate 301, source and drain electrodes 305 at opposite ends of the channel 304 provided by the networked nanotubes, a gate dielectric 311 on the nanotube channel 304 between the source and drain electrodes 305, and a gate electrode 312 on the gate dielectric 311.

The gate electrodes 302 and 312 may be formed of any suitable material. For transparent electronic applications, the gate electrodes can be formed of a TCO, including but not limited to doped and undoped metal oxides such as ITO, IWO, AZO, IZO, indium oxide, and zinc oxide. The gate dielectric 303 and 311 can be one or more thin and/or high-k dielectrics. For example, the gate dielectric 303 and 311 can be a polymer dielectric such as SU8, PVP, PVN, PMS, PS, PVA, PMMA, polyimide, or CPD; an oxide (or nitride) dielectric such as SiN, $SiO_2$, $Al_2O_3$, or HfO; or an organic dielectric such as SAND. The source and drain electrodes 305 can be formed of any suitable material. For example, for transparent electronic applications, the source and drain electrodes 305 can include a same transparent conductive material as the gate electrode 301 and 311 or a different type of transparent conductive material. The transparent conductive material can include, but is not limited to doped and undoped metal oxides such as ITO, IWO, AZO, IZO, indium oxide, and zinc oxide. In a further embodiment, the source and drain electrodes can include an ohmic contact (not shown) between the nanotubes 304 and the source and drain electrodes 305.

Transparent transistors in accordance with aspects of the present invention can be made without the transfer process. In one such embodiment, random network or aligned nanotubes can be grown on a transparent substrate, such as glass, sapphire, or quartz, using a chemical vapor deposition technique. Transparent conductors can be deposited as source and drain electrodes. The source and drain electrodes can include an ohmic contact of a thin layer of gold or palladium film. A dielectric layer can be deposited on the nanotubes and a transparent conductor can be deposited on the dielectric layer for a gate electrode.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

Following are examples which illustrate procedures for practicing the invention. These examples should not be construed as limiting.

EXAMPLE 1

Fabrication of Transparent Aligned Nanotube Transistors on Glass and PET

The aligned nanotubes were first grown on quartz substrates using chemical vapor deposition (CVD). For the specific examples, the aligned SWNTs were grown using chemical vapor deposition at 900° C. with gas flow of 2500 sccm $CH_4$, 10 sccm $C_2H_4$, and 600 sccm $H_2$. The transfer started by coating as-grown aligned SWNTs on a quartz substrate with a 100 nm thick Au film. The Au film was coated onto the SWNTs by an evaporation process using an e-beam evaporator. Revalpha thermal tape (specifically, #3198M from Nitto Denko), which is adhesive at room temperature but loses adhesion above 120° C., was pressed onto the Au film, and then peeled off slowly, resulting in picking up the nanotube/Au film. The thermal tape/Au film/aligned SWNT film was placed onto a target substrate with an ITO back gate and a SU-8 dielectric layer, and the whole structure was heated up to 130° C. on a hot plate to detach the thermal tape. Before transferring the nanotubes, glass substrates were prepared with a common ITO (100 nm) back gate, while PET substrates were prepared with individual back gates made by photolithography, ITO sputtering, and lift off SU-8 2002 (2 µm in thickness) was then spin coated onto both substrates and cured.

As the final stage of the transfer process, the Au film was removed by a gold etchant, leaving the aligned SWNTs on the target substrate. Here, the gold etchant used was $KI/I_2$. Finally, source and drain electrodes made of thin layer of Au plus ITO or ITO only were defined by photolithography and lift-off techniques. In particular, following the transfer, photolithography was used to define openings for source and drain electrodes. For some devices, gold (1 nm) was then evaporated using e-beam evaporator followed by sputtering of ITO (100 nm) to form the contacts. For comparison, some other devices only had ITO as the contact electrodes. Finally, photolithography was again used to mask the channel regions with photoresist, followed by oxygen plasma treatment to etch unwanted carbon nanotubes outside the channels. The thin layer of Au was used to reduce the contact resistance, as shown later.

Figure 8A:
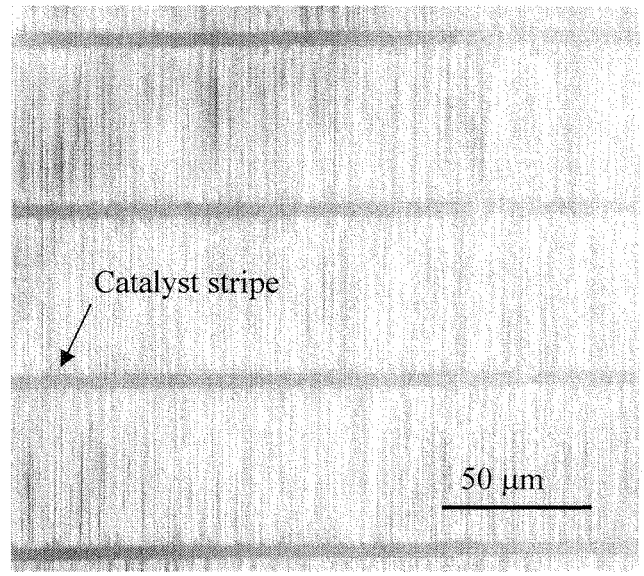
FIGS. 8A-8D show images of fully transparent aligned SWNT transistors on glass and PET substrates in accordance with EXAMPLE 1.
Figure 8B:
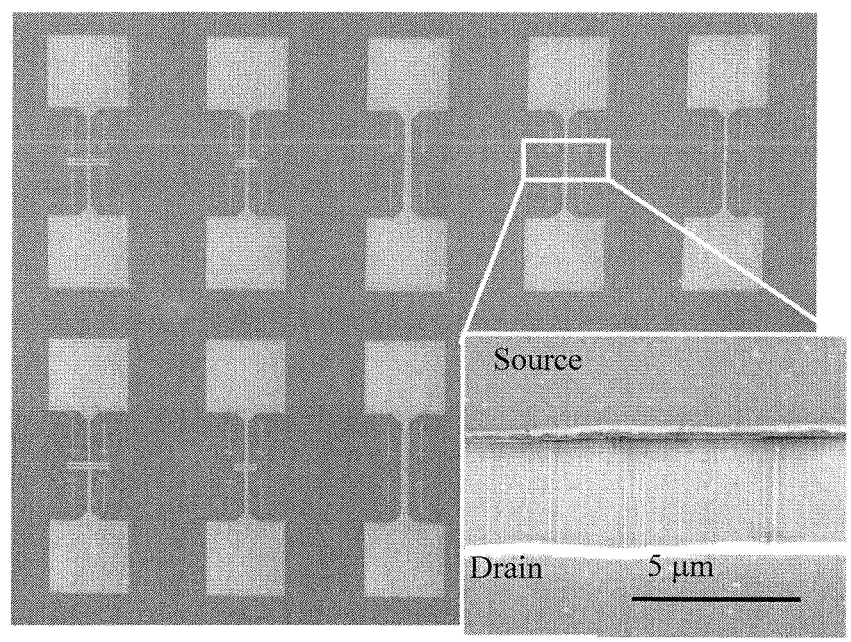

The printing transfer method allowed the construction of devices on any substrates including glass and PET, and a device yield as high as 100% was accomplished easily due to high coverage of the substrates with the aligned SWNTs. FIG. 8A shows a scanning electron microscopy (SEM) image of transferred aligned SWNTs on a glass substrate covered with SU-8. These nanotubes are typically about 50 µm in length and 1~2 nm in diameter with a density of 2~3 tubes per micron. Thus, not all the tubes span between source and drain electrodes for devices with long channels (>50 µm), and the active layer of carbon nanotubes is better described as an aligned network instead of an array for such long channel devices. FIG. 8B is a SEM image of the devices with different channel widths from 8 µm to 100 µm. The channel length keeps at 4 µm. The magnified inset in FIG. 8B shows a SEM image of the aligned SWNTs between source and drain, showing that the nanotubes remain highly ordered after the whole fabrication process.

Figure 8C:
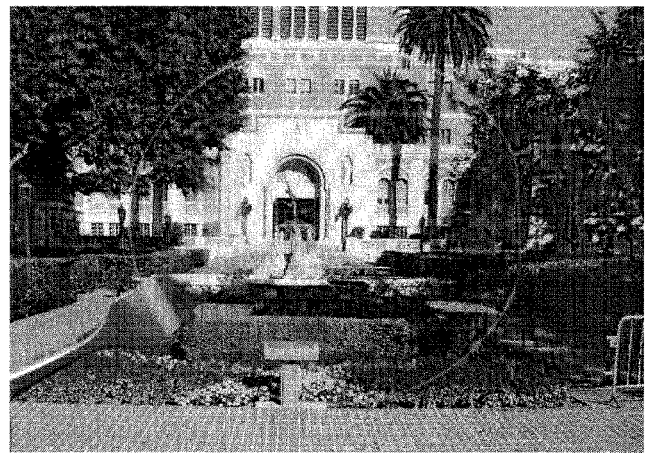
Figure 8D:
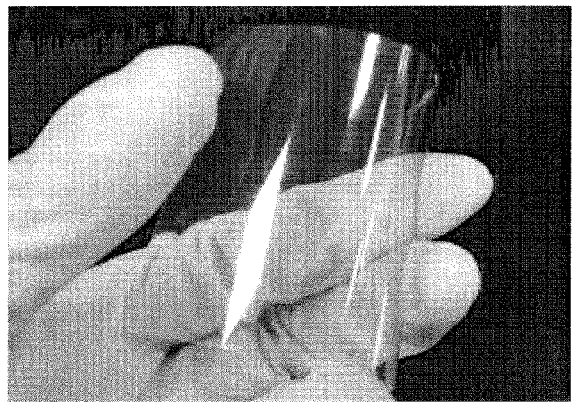
Figure 8E:
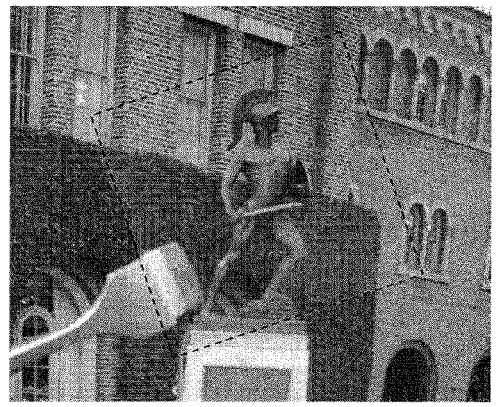

FIG. 8C shows an optical micrograph of a device fabricated on a 4-inch glass wafer and FIGS. 8D and 8E show optical micrographs of devices fabricated on a piece of PET sheet. The devices show clear good transparency, as the backgrounds can be easily seen through these devices.

EXAMPLE 2

Performance of Aligned SWNT TTFTs on Glass

Figure 9A:
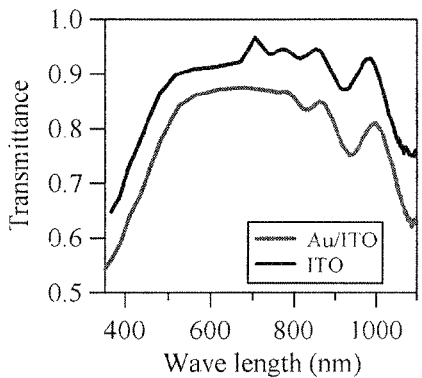
FIGS. 9A-9I show characteristic plots of high mobility transparent aligned SWNT transistors on glass substrates in accordance with EXAMPLE 2.
Figure 9B:
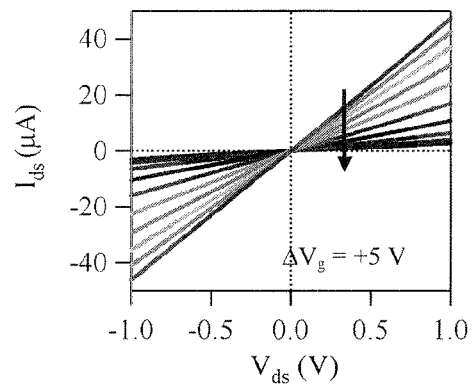
Figure 9C:
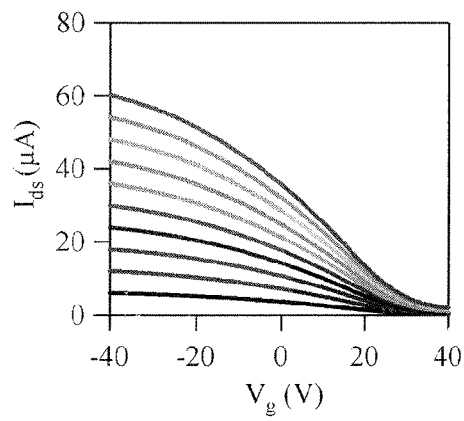
Figure 9D:
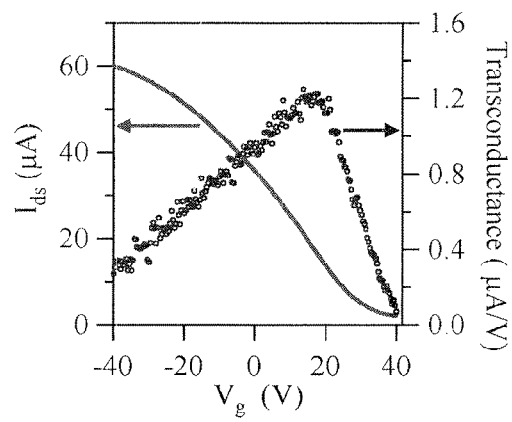
Figure 9E:
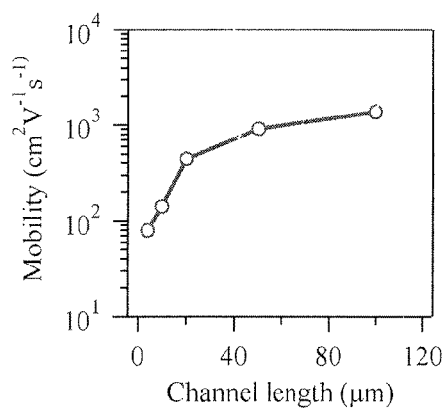
Figure 9F:
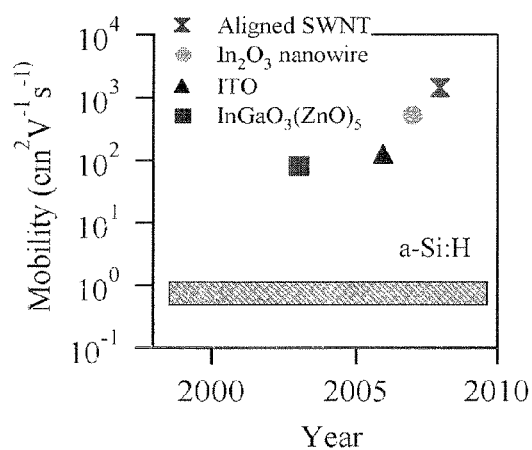

A glass substrate with an array of devices fabricated in accordance with EXAMPLE 1, above, was used to test the performance of aligned SWNT TTFTs on glass. These transistors have aligned nanotubes as the active channel with channel widths of 10, 20, 50, 100, and 200 µm and channel lengths of 4, 10, 20, 50, and 100 µm. The ITO film on glass was used as the back gate, the 2 µm thick SU-8 was used as the gate dielectric, and the two source/drain contact material structures: 1 nm Au/100 nm ITO and 100 nm ITO were used for comparison. FIG. 9A shows measured values comparing the transparency of the devices based on the source/drain contact material structures. As shown in FIG. 9A, the devices with Au/ITO contacts had a transmittance of ~80% in visible light (400~800 nm). Compared with the devices using only ITO as the contacts, the transmittance decreased about 5% due to the thin Au layer. The performance of the devices having the Au/ITO contacts was characterized and the results shown in FIGS. 9B-9F. In particular, FIGS. 9B and 9C are representative plots of drain-source current ($I_{ds}$) versus drain-source voltage ($V_{ds}$) and $I_{ds}$ versus gate voltage ($V_g$), respectively, for a device with a channel length of 50 µm and a width of 100 µm. The nanotube density was measured to be 2~3 aligned SWNTs per micron. The device showed p-type transistor behavior and an on/off ratio ~20 due to the presence of metallic nanotubes. The large operation voltage (gate voltage) can be reduced by employing thin and/or high-k dielectrics, such as HfO or self-assembled organic nano-dielectrics. FIG. 9D gives a typical $I_{ds}$-$V_g$ plot (left axis) and the extracted transconductance ($dI_{ds}/dV_g$) at $V_{ds}$=1 V (right axis), showing a peak value of 1.2 µA/V. The transconductance can be easily improved by utilizing higher capacitance dielectrics, such as high-k dielectrics instead of the SU-8 used here. The effective mobility (µ) of the devices was calculated from the maximum transconductance by applying the following equations.

$$\mu = \frac{L}{V_d C_W W} \cdot \frac{dI_d}{dV_g},$$

Where $V_d$ is the voltage at the drain, $V_g$ is the voltage at the gate, $I_d$ is the current at the drain, L is the channel length, and W is the channel width. $C_W$ is the specific capacitance per unit area of the aligned nanotube channel and can be calculated as follows.

$$C_W = \frac{D}{\left[ C_Q^{-1} + \frac{1}{2\pi\varepsilon_0\varepsilon_S} \cdot \log\left[ \frac{\sinh(2\pi t D)}{\pi R D} \right] \right]}$$

where D is the density of nanotubes, $C_Q$ is the quantum capacitance of nanotubes, t is the thickness of the dielectric layer, R is the radius of nanotubes, $\varepsilon_o$ is the electric constant (field without dielectric), and $\varepsilon_S$ is the dielectric constant at the interface where the nanotubes are placed. For these examples, $\varepsilon_s$ was estimated to be ~2 because of the air/SWNT/SU8 structure. The value of $C_Q$ used for these calculations was obtained from "High Performance Electrolyte Gated Carbon Nanotube Transistors," by Rosenblatt et al. (Nano Lett., Vol. 2, pp 869-872 (2002)). FIG. 9E shows the mobility plotted against channel length. An effective mobility of 1,300 cm$^2$V$^{-1}$s$^{-1}$ was realized for the devices with channel length of 100 μm, which is higher than obtained through related art transparent devices. Similar mobility and transconductance were observed for devices with similar dimensions. The variation of the mobility and transconductance was within ~30%, indicating the uniformity of the aligned nanotube network. Channel length dependent mobility was observed, indicating the presence of small Schottky barriers between the carbon nanotubes and the Au/ITO contacts. As a reference, FIG. 9F summarizes the mobility of representative transparent devices reported in recent years and amorphous silicon (a-Si:H). Referring to FIG. 9F, it can be seen that aligned nanotube devices fabricated in accordance to embodiments of the present invention offer much higher mobility than competing materials, such as $In_2O_3$ nanowires (~514 cm$^2$V$^{-1}$s$^{-1}$), $In_2O_3$ films (~120 cm$^2$V$^{-1}$s$^{-1}$), and $InGaO_3(ZnO)_5$ films (~80 cm$^2$V$^{-1}$s$^{-1}$).

The high mobility of aligned nanotube devices fabricated in accordance with embodiments of the present invention enables low operating voltage, low power consumption, and high switching speed, which are useful for applications such as transparent circuits in portable displays.

Figure 9G:
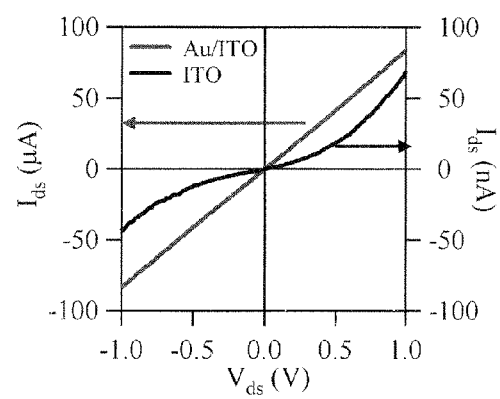

Furthermore, contact materials for the source and drain have effects on the device performance. To illustrate these effects, devices using different contacts were fabricated, and FIG. 9G shows the $I_{ds}$ versus $V_{ds}$ plots for a device with Au/ITO contacts (left axis) and ITO only contacts (right axis). It was found that the devices with a thin Au layer exhibited larger conductance by about three orders of magnitude than those without Au. This difference in conductance may be attributed to the difference in work functions for gold (5.3 eV) and ITO (3.9~4.4 eV). Compared with the nanotube work function (4.7~5.1 eV), gold can form rather ohmic-like contacts to the nanotubes, while ITO presents a Schottky barrier at contacts. This is also consistent with the observation that the Au/ITO contacts led to a linear $I_{ds}$-$V_{ds}$ curve, while the ITO contact yielded nonlinear $I_{ds}$-$V_{ds}$ curve (FIG. 9G). Accordingly, embodiments of the present invention can include additional contact materials, such as gold to reduce the Schottky barrier between ITO and the nanotubes for transparent electronics.

Figure 9H:
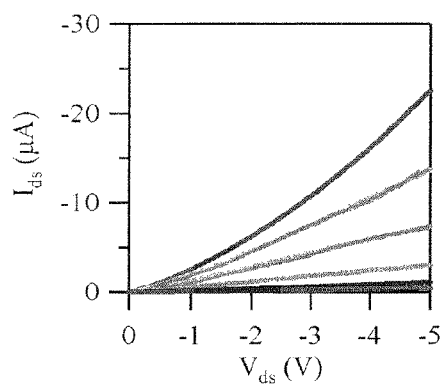
Figure 9I:
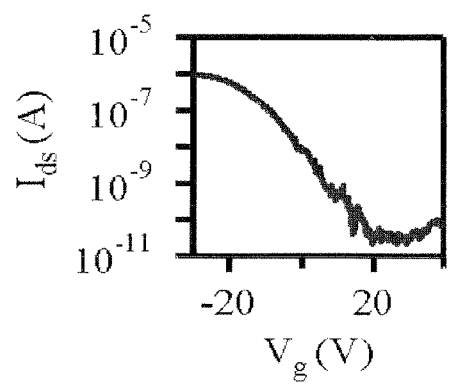

Improvement of the on/off ratio for the transparent aligned nanotubes devices can be further achieved with electrical breakdown to remove metallic carbon nanotubes. During the breakdown process, $V_{ds}$ was increased gradually while the $V_g$ was kept constant at a high positive value (20 V). FIG. 9H shows a family of $I_{ds}$-$V_{ds}$ curves of a device after breakdown. Gate voltages with steps of 5 V were applied. The results indicate good gate dependence and on/off ratio with clearly separated curves. In these examples, the electrical breakdown led to lower effective device mobility, as inevitably some semiconductive nanotubes were also damaged due to the high $V_{ds}$ used during breakdown. For typical devices, the mobility decreased from ~1300 cm$^2$V$^{-1}$s$^{-1}$ before breakdown to 700~800 cm$^2$V$^{-1}$s$^{-1}$ after breakdown when the on/off ratio was increased by a factor of 2.5. For the device, an output current of ~-23 μA was obtained at $V_{ds}$=-5 V under $V_g$=-10 V, revealing device resistance of ~220 kΩ. FIG. 9I is a plot of the $I_{ds}$-$V_g$ curve in log scale with $V_{ds}$=0.5 V, showing an on/off ratio of 3×10$^4$.

EXAMPLE 3

Performance of Aligned SWNT TTFTs on PET

Figure 10A:
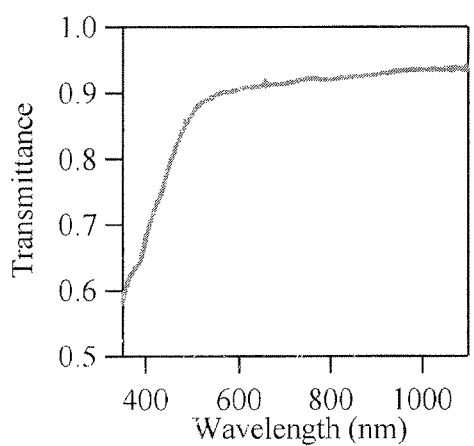
FIGS. 10A-10D show characteristic plots of fully transparent and flexible aligned SWNT transistors on PET substrates in accordance with EXAMPLE 3.
Figure 10B:
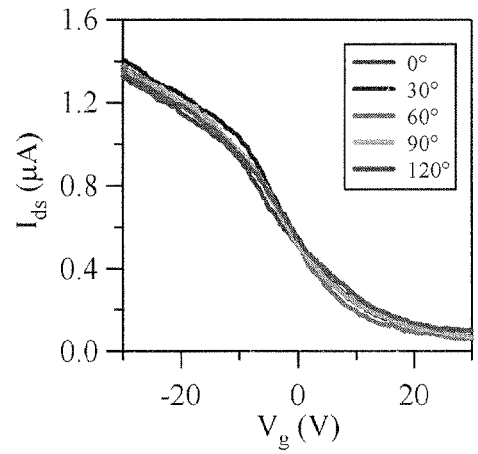
Figure 10C:
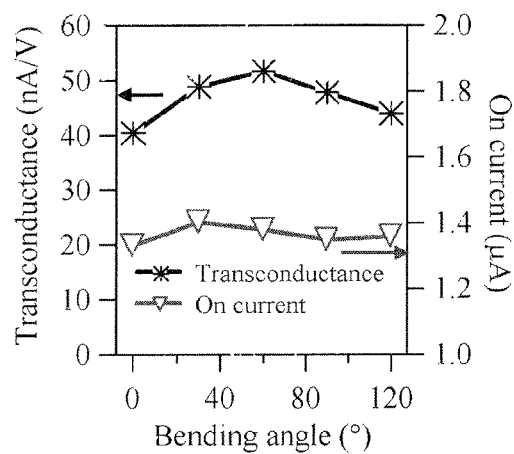

Fully transparent and flexible aligned SWNTs devices using PET substrates were also fabricated in accordance with EXAMPLE 1 to test the performance of aligned SWNT TTFTs on a flexible substrate. For these tests, devices having the ITO back gate, 2 μm thick SU-8 gate dielectric, and ITO source and drain contact material were fabricated. FIG. 10A shows a plot of the transmittance of the transparent, flexible devices. The optical transmission is ~80% in the 350-1200 nm wavelength range. To evaluate the flexibility of the devices, $I_{ds}$-$V_g$ measurements were performed under bending of the substrates with different angles and the plots are shown in FIG. 10B. The $I_{ds}$-$V_g$, curves correspond to a device bent for 0°, 30°, 60°, 90°, and 120°, respectively, with a channel length of 10 μm and width of 200 μm. The transconductance and on-current of the device at each bending angle were extracted from these curves, and were plotted in FIG. 10C. As illustrated by FIGS. 10B and 10C, the device continued to perform, for bending angles from 0° to 120°, and the variation for both the transconductance (left axis) and the on-current (right axis) were rather small. As illustrated, fully transparent and flexible transistors were fabricated, showing very good mechanical flexibility for bending up to 120 degrees.

Figure 10D:
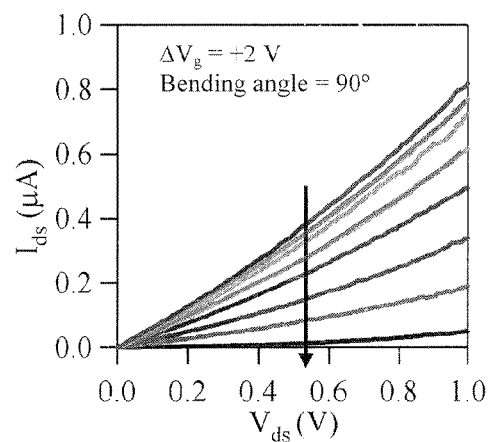

Furthermore, the device was successfully operated as a transistor on a bent substrate as shown in FIG. 10D, where $I_{ds}$-$V_{ds}$ curves at different $V_g$ were plotted. As a whole, these data represent that aligned nanotube transparent transistors were successfully fabricated on PET substrates with good mechanical flexibility. The comparatively low transconductance of these devices resulted from using only ITO to contact the nanotubes for high transparency (i.e., additional contact material such as gold was not used in these cases). In case high transconductance is needed for such flexible transparent devices, the transconductance can be easily improved by depositing a thin Au layer between SWNTs and ITO, as described above with respect to EXAMPLE 2.

EXAMPLE 4

Transparent N-type Transistor by PEI Coating

Figure 11A:
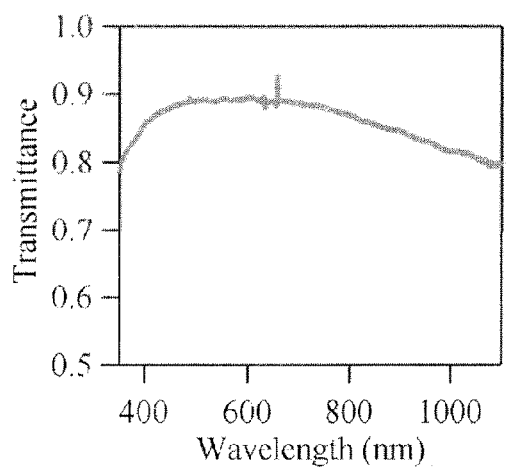
FIGS. 11A-11C show characteristics of a device having a polyethyleneimine (PEI) coating in accordance with EXAMPLE 4.
Figure 11B:
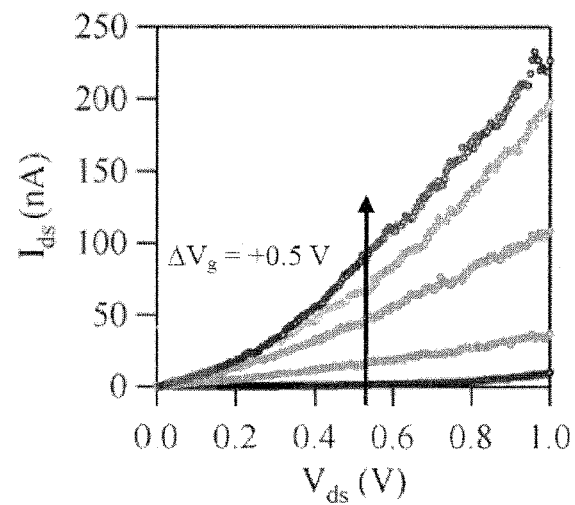
Figure 11C:
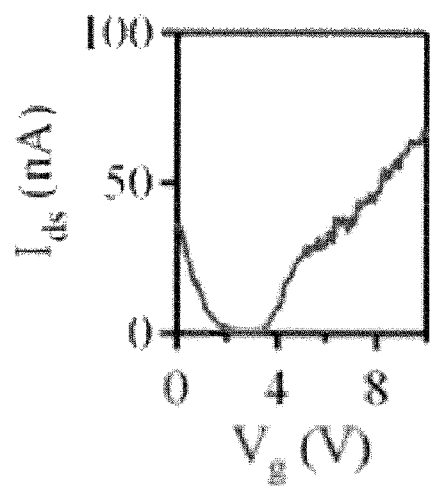

A TTFT was prepared on a glass substrate in accordance with EXAMPLE 1 with the inclusion of a PEI coating on the transferred aligned SWNTs. FIG. 11A shows the transmittance of the devices on glass after PEI coating, and indicates that PEI coating does not hurt the transparency of the devices. FIG. 11B shows the Ids–Vg curves under different gate voltage with a step of 0.5 V. As shown in FIG. 11B, increasing conductance occurs with increasing Vg, which is indicative of n-type transport. FIG. 11C shows the Ids–Vg characteristics of the device after PEI coating, showing ambipolar transport. The n-branch regime shown in FIG. 11C was used for FIG. 11B (Vg from 2 to 4 V).

EXAMPLE 5

Random Network Nanotubes

To broaden the application area, aligned nanotubes can be replaced by random network nanotubes. FIG. 12A shows a SEM image of CNT network prepared by dispersing CNTs in solution and then casting the CNTs on an appropriate substrate. FIG. 12B shows CNT network grown by CVD, which can then be transferred onto an appropriate substrate using an embodiment of the subject transfer printing method. FIG. 12C shows an optical micrograph of density gradient column showing different bands made of nanotubes with different chiralities. Separated CNTs can be cast on an appropriate substrate. FIG. 12D shows the absorption spectrum showing the enrichment of semiconductive and metallic nanotubes.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to utilize or combine such feature, structure, or characteristic in connection with other ones of the embodiments.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

What is claimed is:

1. A transparent thin-film device, comprising:
   aligned carbon nanotubes on a transparent substrate;
   source and drain electrodes contacting the aligned carbon nanotubes, the source and drain electrodes comprising a first transparent conductor, wherein the source and drain electrodes further comprise an ohmic contact layer between the aligned carbon nanotubes and the first transparent conductor; and
   a gate electrode comprising a second transparent conductor and separated from the aligned carbon nanotubes by a dielectric layer.

2. The transparent thin-film device according to claim 1, wherein the ohmic contact layer comprises a gold film.

3. The transparent thin-film device according to claim 1, further comprising a polyethyleneimine (PEI) coating on the aligned carbon nanotubes for doping the aligned carbon nanotubes.

4. The transparent thin-film device according to claim 1, wherein the first transparent conductor comprises a same material as the second transparent conductor.

5. The transparent thin-film device according to claim 1, wherein the first transparent conductor comprises at least one of indium tin oxide (ITO), indium tungsten oxide (IWO) and aluminum zinc oxide (AZO), and wherein the second transparent conductor comprises at least one of ITO, IWO, and AZO.

6. A transparent thin-film device, comprising:
   aligned carbon nanotubes on a transparent substrate;
   source and drain electrodes contacting the aligned carbon nanotubes, the source and drain electrodes comprising a first transparent conductor, wherein the first transparent conductor comprises a network of nanotubes; and
   a gate electrode comprising a second transparent conductor and separated from the aligned carbon nanotubes by a dielectric layer.

7. The transparent thin-film device according to claim 1, wherein the gate electrode is disposed on the transparent substrate, the dielectric layer is disposed on the gate electrode, the aligned carbon nanotubes are disposed on the dielectric layer, and the source and drain electrodes are disposed at opposite ends of a channel provided by the aligned carbon nanotubes.

8. The transparent thin-film device according to claim 1, wherein the substrate comprises glass or plastic.

9. The transparent thin-film device according to claim 1, wherein the dielectric layer comprises a transparent polymer dielectric, a transparent organic dielectric, an oxide or a nitride.

10. A transparent thin-film transistor (TTFT), comprising:
    carbon nanotubes on a substrate and providing a channel region; and
    source and drain electrodes on the carbon nanotubes, the source and drain electrodes comprising a gold film contacting the carbon nanotubes and a transparent conductive oxide on the gold film.

11. The TTFT according to claim 10, wherein the carbon nanotubes are aligned carbon nanotubes.

12. The TTFT according to claim 10, wherein the carbon nanotubes are random network carbon nanotubes.

13. The TTFT according to claim 10, wherein the carbon nanotubes are separated nanotubes of the semiconductor nanotube type.

14. The TTFT according to claim 10, further comprising a dopant on the carbon nanotubes for affecting conductivity type of the TTFT.

15. The TTFT according to claim 10, wherein the TTFT has a transmittance of at least 80% for visible light.

16. The transparent thin-film device according to claim 3, wherein the aligned carbon nanotubes are disposed on the transparent substrate, the source and drain electrodes are disposed at opposite ends of a channel provided by the aligned carbon nanotubes, the dielectric layer is disposed on the aligned carbon nanotubes between the source and drain electrodes, and the gate electrode is disposed on the dielectric layer.

* * * * *

UNITED STATES PATENT AND TRADEMARK OFFICE
CERTIFICATE OF CORRECTION

PATENT NO. : 8,847,313 B2  
APPLICATION NO. : 12/538597  
DATED : September 30, 2014  
INVENTOR(S) : Chongwu Zhou et al.

Page 1 of 1

It is certified that error appears in the above-identified patent and that said Letters Patent is hereby corrected as shown below:

In the Specification

Column 4,  
Line 41, "channel," should read --channel.--.

Column 5,  
Line 67, "(CPS)." should read --(CPB).--.

Column 8,  
Lines 6-7, "provide an. N-type" should read --provide an N-type--.

Column 12,  
Lines 62-65, "$\in_o ... \in_s ... \in_s$" should read --$\varepsilon_0$ ... $\varepsilon_s$ ... $\varepsilon_s$--.

Signed and Sealed this  
Nineteenth Day of May, 2015

Michelle K. Lee  
*Director of the United States Patent and Trademark Office*